United States Patent
Sugihara et al.

(10) Patent No.: US 11,561,471 B2
(45) Date of Patent: Jan. 24, 2023

(54) PHOTORESIST COMPOSITION

(71) Applicant: SUMITOMO CHEMICAL COMPANY, LIMITED, Tokyo (JP)

(72) Inventors: Masako Sugihara, Osaka (JP); Takashi Nishimura, Osaka (JP); Hiromu Sakamoto, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/371,702

(22) Filed: Dec. 7, 2016

(65) Prior Publication Data
US 2017/0168393 A1  Jun. 15, 2017

(30) Foreign Application Priority Data
Dec. 9, 2015  (JP) .............................. JP2015-239949

(51) Int. Cl.
| | | |
|---|---|---|
| *G03F 7/039* | (2006.01) | |
| *G03F 7/30* | (2006.01) | |
| *G03F 7/38* | (2006.01) | |
| *C08F 220/28* | (2006.01) | |
| *C08F 220/18* | (2006.01) | |

(52) U.S. Cl.
CPC ...... *G03F 7/0392* (2013.01); *C08F 220/1802* (2020.02); *C08F 220/281* (2020.02); *C08F 220/282* (2020.02); *C08F 220/283* (2020.02); *G03F 7/039* (2013.01); *G03F 7/0397* (2013.01); *G03F 7/30* (2013.01); *G03F 7/38* (2013.01)

(58) Field of Classification Search
CPC .... G03F 7/0392; G03F 7/0397; G03F 7/0382; G03F 7/30; G03F 7/38
USPC ...................... 430/270.1, 905, 910
See application file for complete search history.

(56) References Cited

U.S. PATENT DOCUMENTS

| | | | | |
|---|---|---|---|---|
| 6,251,569 | B1* | 6/2001 | Angelopoulos | G03F 7/038 430/18 |
| 8,999,622 | B2* | 4/2015 | Iwato | G03F 7/2041 430/326 |
| 9,091,916 | B2* | 7/2015 | Shimizu | G03F 7/0397 |
| 9,146,467 | B2* | 9/2015 | Houlihan | C07C 307/02 |
| 9,201,303 | B2* | 12/2015 | Kawamura | G03F 7/20 |
| 2005/0058940 | A1* | 3/2005 | Schadt, III | G03F 7/0397 430/270.1 |
| 2007/0298352 | A1 | 12/2007 | Kobayashi et al. | |
| 2008/0118860 | A1* | 5/2008 | Harada | C08F 24/00 430/270.1 |
| 2009/0068342 | A1* | 3/2009 | Senzaki | G03F 7/0397 427/58 |
| 2010/0047715 | A1* | 2/2010 | Washio | G03F 7/0046 430/286.1 |
| 2010/0233617 | A1 | 9/2010 | Wada | |
| 2013/0071789 | A1 | 3/2013 | Iwashita et al. | |
| 2013/0242209 | A1 | 9/2013 | Takaki et al. | |
| 2015/0010855 | A1 | 1/2015 | Tsuchimura et al. | |
| 2015/0185610 | A1 | 7/2015 | Hirano et al. | |

FOREIGN PATENT DOCUMENTS

| | | |
|---|---|---|
| JP | 3-192173 A | 8/1991 |
| JP | 2005-91433 A | 4/2005 |
| JP | 2908-7409 A | 1/2008 |
| JP | 2009-93137 A | 4/2009 |
| JP | 2010-286646 A | 12/2010 |
| JP | 2011-180495 A | 9/2011 |
| JP | 2012-63728 A | 3/2012 |
| JP | 2013-205520 A | 3/2012 |
| JP | 2012-128009 A | 7/2012 |
| JP | 2013-68646 A | 4/2013 |
| JP | 2013-68846 A | 4/2013 |
| JP | 2014-41328 A | 3/2014 |
| TW | 201409174 A | 3/2014 |

OTHER PUBLICATIONS

Taiwan Office Action issued in Taiwan Patent Application No. 105140080 dated Nov. 14, 2019.
Japanese Office Action for Japanese Application No. 2016-239160, dated Dec. 28, 2020, with English translation.
Chinese Office Action and Search Report (including an English translation thereof) issued in the corresponding Chinese Patent Application No. 201611114494.1 dated Sep. 2, 2020.
Chinese Office Action and Search Report (including an English translation thereof) issued in the corresponding Chinese Patent Application No. 201611114494.1 dated Jun. 23, 2021.
Japanese Office Action (including an English translation thereof) issued in the corresponding Japanese Patent Application No. 2016-239160 dated Mar. 8, 2022.

(Continued)

*Primary Examiner* — John S Chu
(74) *Attorney, Agent, or Firm* — Birch, Stewart, Kolasch & Birch, LLP

(57) ABSTRACT

A photoresist composition comprising:
a resin which has a structural unit represented by formula (I):

(I)

wherein $R^1$ represents a hydrogen atom, a halogen atom, or a C1 to C6 alkyl group which optionally has a halogen atom, and $R^2$ represents a C1 to C42 hydrocarbon group which optionally has a substituent;
an alkali-soluble resin;
an acid generator; and
a solvent.

7 Claims, No Drawings

(56) References Cited

OTHER PUBLICATIONS

Japanese Office Action for Japanese Application No. 2021-168608, dated Oct. 7, 2022, with an English translation.

* cited by examiner

PHOTORESIST COMPOSITION

This nonprovisional application claims priority under 35 U.S.C. 119 (a) on Patent Application No. 2015-239949 filed in JAPAN on Dec. 9, 2015, the entire contents of which are hereby incorporated by reference.

FIELD OF THE INVENTION

The present invention relates to a photoresist composition and a method for producing a photoresist pattern.

BACKGROUND OF THE INVENTION

The electrodes which are a bump with height 4 to 150 μm are formed on a substrate in a process of mounting pins by a thin film for semiconductor chips.

As to photoresist compositions for producing a bump, US2009/068342A1 mentions a photoresist composition which comprises a resin comprising a structural unit derived from 2-ethoxyethylacylate.

SUMMARY OF THE INVENTION

The present application provides the inventions as follow.
[1] A photoresist composition comprising:
a resin which has a structural unit represented by formula (I):

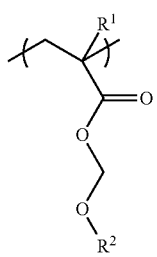

(I)

wherein $R^1$ represents a hydrogen atom, a halogen atom, or a C1 to C6 alkyl group which optionally has a halogen atom, and $R^2$ represents a C1 to C42 hydrocarbon group which optionally has a substituent;
an alkali-soluble resin;
an acid generator; and
a solvent.
[2] The photoresist composition according to [1], wherein. $R^2$ represents a C1 to C20 liner aliphatic hydrocarbon group, or a C3 to C20 branched aliphatic hydrocarbon group.
[3] The photoresist composition according to [1] or [2], wherein the resin which has a structural unit represented by formula (I) further has a structural unit selected from the group consisting of a structural unit represented by formula (a2-1), a structural unit represented by formula (a2-2) and a structural unit represented by formula (a2-3) and a structural unit having a lactone ring and no acid-labile group:

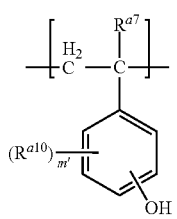

(a2-1)

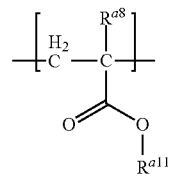

(a2-2)

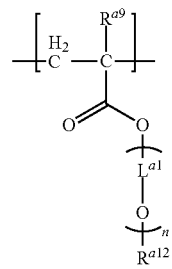

(a2-3)

where $R^{a7}$ $R^{a8}$ and $R^{a9}$ each independently represent a hydrogen atom or a methyl group,
$R^{a10}$ each independently represents a C1 to C6 alkyl group or a C1 to C6 alkoxyl group,
$R^{a11}$ represents a hydrogen atom, or a C1 to C20 primary or secondary hydrocarbon group,
$R^{a12}$ each independently represents a C1 to C6 primary or secondary alkyd group,
$L^{a1}$ each independently represents a C2 to C6 alkanediyl group where the carbon atoms bonded to an oxygen atom is a primary or secondary carbon atom,
m' represents an integer of 0 to 4, and n represents an integer of 1 to 30.
[4] The photoresist composition according to [3], wherein the resin which has a structural unit represented by formula (I) further has a structural unit selected from the group consisting of the structural unit represented by formula (a2-3) and the structural unit having a lactone ring and no acid-labile group.
[5] The photoresist composition according to any one of [1] to [4], wherein the weight of solvent accounts for 40% to 75% by weight of the total weight of the photoresist composition.
[6] The photoresist composition according to any one of [1] to [5], further comprising a resin which has a structural unit represented by formula (a1-2):

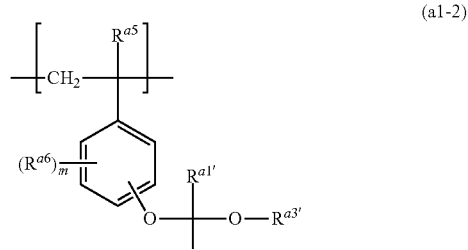

(a1-2)

wherein $R^{a1'}$ and $R^{a2'}$ independently each represent a hydrogen atom or a C1 to C12 hydrocarbon group,
$R^{a3'}$ represents a C1 to C20 hydrocarbon group, or $R^{a3'}$ are bonded to $R^{a1'}$ or $R^{a2'}$ to form a C2 to C20 divalent heterocyclic group where a methylene group can be replaced by an oxygen atom or a sulfur atom, $R^{a5}$ represents a hydrogen atom or a methyl group, $R^{a6}$ independently each represents a C1 to C6 alkyl group or a C1 to C6 alkoxy group, and m represents an integer of 0 to 4.

[7] A process for producing a photoresist pattern comprising:

(1) a step of applying the photoresist composition according to any one of [1] to [6] on a substrate, (2) a step of forming a photoresist composition film by drying the photoresist composition, (3) a step of exposing the photoresist composition film, and (4) a step of developing the exposed photoresist composition film.

The photoresist composition of the present invention is high in resolution.

EMBODIMENTS OF THE PRESENT INVENTION

The photoresist composition of the disclosure comprises a resin which has a structural unit represented by formula (I):

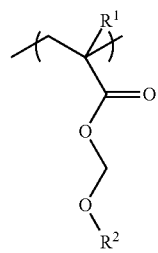

(I)

wherein $R^1$ represents a hydrogen atom, a halogen atom, or a C1 to C6 alkyl group which optionally has a halogen atom, and $R^2$ represents a C1 to C42 hydrocarbon group which optionally has a substituent;

an alkali-soluble resin;

an acid generator; and a solvent.

The resin which has a structural unit represented by formula (I) is sometimes referred to as "Resin (A1)". The alkali-soluble resin is sometimes referred to as "Resin (A2)". The photoresist composition may further contain another resin than the above-mentioned resins, a quencher, an adhesion-improving agent, a surfactant, and so on <Resin (A1)>

Resin (A1) has a structural unit represented by formula (I). The structural unit represented by formula (I) is one of a structural unit having an acid-labile group which structural unit is sometimes referred to as "structural unit (a1)" Herein, the "acid-labile group" means a group capable of being eliminated by the action of an acid to form a hydrophilic group such as a hydroxyl group or carboxy group, that is a group capable of increasing solubility in an aqueous alkali solution by action of an acid.

Typical examples of the acid-labile group include a group represented by —C(=O)—O—C($R^{a1}$) ($R^{a2}$) ($R^{a3}$) and a group represented by —O—C($R^{a1'}$) ($R^{a2'}$)—O—($R^{a3'}$) both of which the structural units represented by formulae (a1-1) and (a1-2) are described later have respectively.

Resin (A1) has a structural unit represented by formula (I) as a structural unit (a1), and therefore the resin increases solubility in an aqueous alkali solution by action of an acid.

The expression "increasing solubility in an aqueous alkali solution by action of an acid" means increasing solubility in an aqueous alkali solution by contacting an acid.

Preferably Resin (A1) is insoluble or hardly soluble in an aqueous alkali solution before contacting an acid, but becomes soluble in an aqueous alkali solution after contacting an acid. Resin (A1) may further have known structural units, such as another structural unit (a1) than the structural unit represented by formula (I), a structural unit having no acid-labile group, which structural unit is sometimes referred to as "structural unit (a2)", or both of them.

Examples of the halogen atom represented by $R^1$ include a fluorine atom, a chlorine atom, a bromine atom and an iodine atom.

Examples of the alkyl group represented by $R^1$ include a methyl group, an ethyl group, n-propyl group, isopropyl group, n-butyl group, sec-butyl group, tort-butyl group, n-pentyl group and n-hexyl group.

For $R^1$, examples of the alkyl group which has a halogen atom include trifluoromethyl group, a perfluoroethyl group, a perfluoropropyl group, a perfluoro(isopropyl) group, a perfluorobutyl group, a perfluoro (sec-butyl) group, a perfluoro (tert-butyl) group, a perfluoropentyl group, a perfluorohexyl group, a perchlorometyl group, a perbromometyl group and a periodometyl group.

$R^1$ preferably represents a hydrogen atom or a methyl group. For $R^2$, examples of the hydrocarbon group include a C1 to C20 aliphatic hydrocarbon group, a C6 to C42 aromatic hydrocarbon group, and any combination of the aliphatic hydrocarbon group and the aromatic hydrocarbon group.

The aliphatic hydrocarbon group for $R^2$ includes a chain aliphatic hydrocarbon group, a cyclic aliphatic hydrocarbon group, and any combination of these aliphatic hydrocarbon groups. The aliphatic hydrocarbon group may have a carbon-carbon double bond, which is preferably a saturated aliphatic hydrocarbon group.

Examples of the chain aliphatic hydrocarbon group include a C1 to C20 linear aliphatic hydrocarbon group such as a methyl group, an ethyl group, n-propyl group, n-butyl group, n-pentyl group and n-hexyl group, n-heptyl group, n-octyl group, n-nonyl group and n-decanyl group; and a C3 to C20 branched aliphatic hydrocarbon group such as 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, and 4-methylpentyl group.

Typical examples of the aliphatic hydrocarbon group for $R^2$ include a C1 to C20 linear aliphatic hydrocarbon group and a C3 to C20 branched aliphatic hydrocarbon group.

The aliphatic hydrocarbon group for $R^2$ is preferably a linear aliphatic hydrocarbon group, more preferably a C1 to C15 linear alkyl group, still more preferably a C1 to C10 linear alkyl group.

The cyclic aliphatic hydrocarbon group, which is sometimes referred to as "alicyclic hydrocarbon group", may be a monocyclic or polycyclic one.

The alicyclic hydrocarbon group has preferably 3 to 20 carbon atoms, more preferably 3 to 12 carbon atoms.

Examples of the monocyclic aliphatic hydrocarbon group include those in which one hydrogen atom has been removed from any one of cycloalkanes represented by formulae (KA-1) to (KA-7)

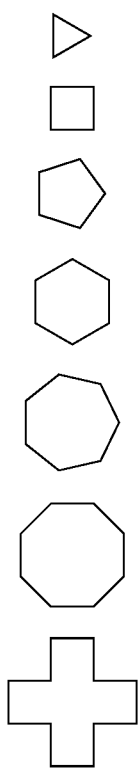

(KA-1)
(KA-2)
(KA-3)
(KA-4)
(KA-5)
(KA-6)
(KA-7)

Examples of the polycyclic aliphatic hydrocarbon group include those in which one hydrogen atom has been removed from any one of cycloalkanes represented by formulae (KA-8) to (KA-19).

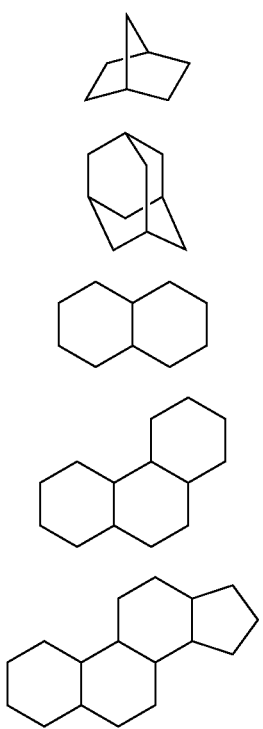

(KA-8)
(KA-9)
(KA-10)
(KA-11)
(KA-12)

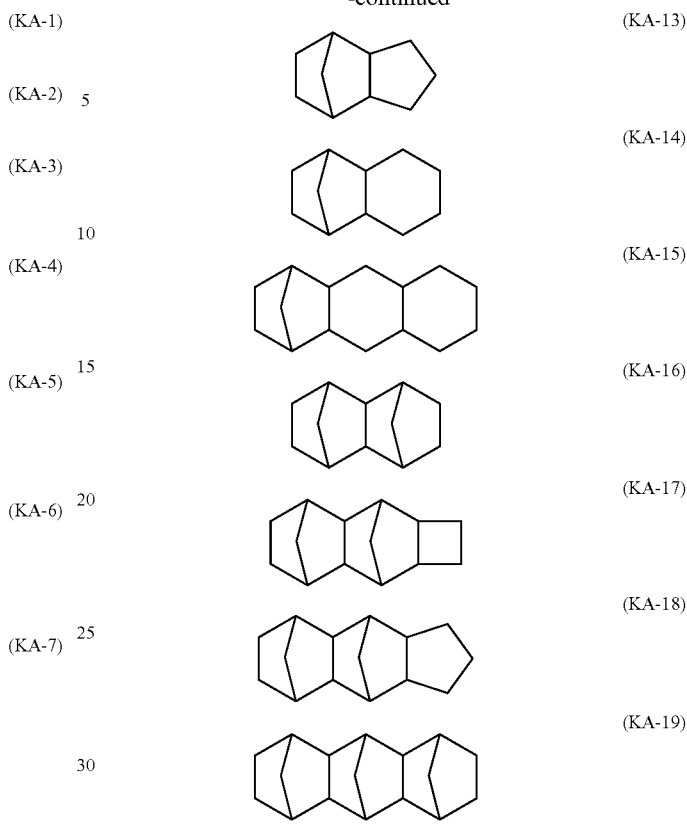

(KA-13)
(KA-14)
(KA-15)
(KA-16)
(KA-17)
(KA-18)
(KA-19)

Examples of the aromatic hydrocarbon groups include C6 to C42 aromatic hydrocarbon groups such as a phenyl group, a naphthyl group, an antlyl group, a biphenyl group, a phenanthryl group, a fluorenyl group, a tolyl group, a xylyl group, a cumenyl group, a mesityl group, a 2,6-diethylphenyl group, and 2-methyl-6-ethylphenyl group. The aromatic hydrocarbon group is preferably a C6 to C30 aromatic hydrocarbon group, more preferably a C6 to C20 aromatic hydrocarbon group, still more preferably a C6 to C12 aromatic hydrocarbon group.

Examples of the substituent on the hydrocarbon group represented by $R^2$ include a halogen atom, a hydroxy group, an alkoxy group, an acyl group, an acyloxy group, an aryl group, an aralkyl group and an aryloxy group.

Examples of the alkoxy group include C1 to 012 alkoxy groups such as a methoxy group, an ethoxy group, a n-propoxy group, an isopropoxy group, a n-butoxy group, a tert-butoxy group, a sec-butoxy group, a n-pentyloxy group, a n-hexyloxy group, a n-heptyloxy group, a n-octyloxy group, a n-decyloxy group and a n-dodecyloxy group.

Examples of the acyl group include C2 to C12 acyl groups such as an acetyl group, a propionyl group, a butyryl group, a vareyl group, a hexylcarbonyl group, a heptylcarbonyl group, an octylcarbonyl group, a decylcarbonyl group, a dodecylcarbonyl group and a benzoyl group.

Examples of the acyloxy group include C2 to C14 acyloxy groups such as an acetyloxy group, a propionyloxy group, a butyryloxy group and an isobutyryloxy group.

Examples of the aralkyl group include C7 to C12 aralkyl groups, such as a benzyl group, a phenethyl group, a phenylpropyl group, naphthylmethyl group and naphthylethyl group.

Examples of the aryloxy group include C6 to C14 aryloxy groups, such as a phenyloxy group, a naphthyloxy group, an antlyloxy group, a biphenyloxy group, a phenanthryloxy group and a fluorenyloxy group.

Typical examples of $R^2$ include a C1 to C20 linear aliphatic hydrocarbon group and a C3 to C20 branched aliphatic hydrocarbon group.

$R^2$ is preferably a C1 to C15 aliphatic hydrocarbon group, and more preferably a C1 to C15 alkyl group or a C3 to C15 alicyclic hydrocarbon group.

Examples of the structural unit represented by formula (I) include the following ones,

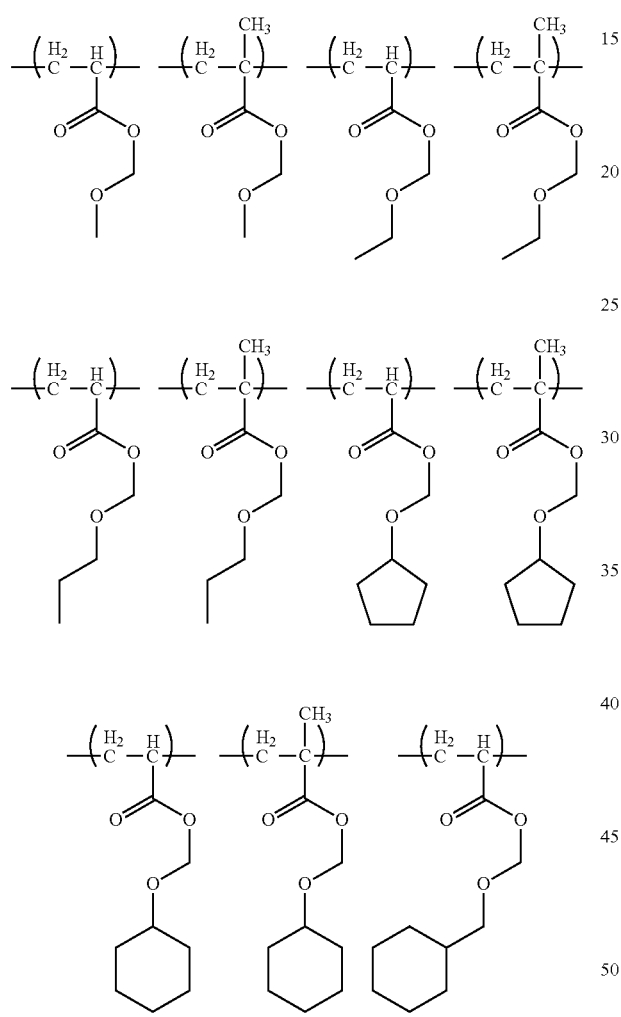
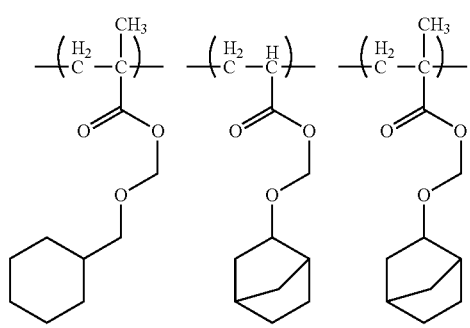
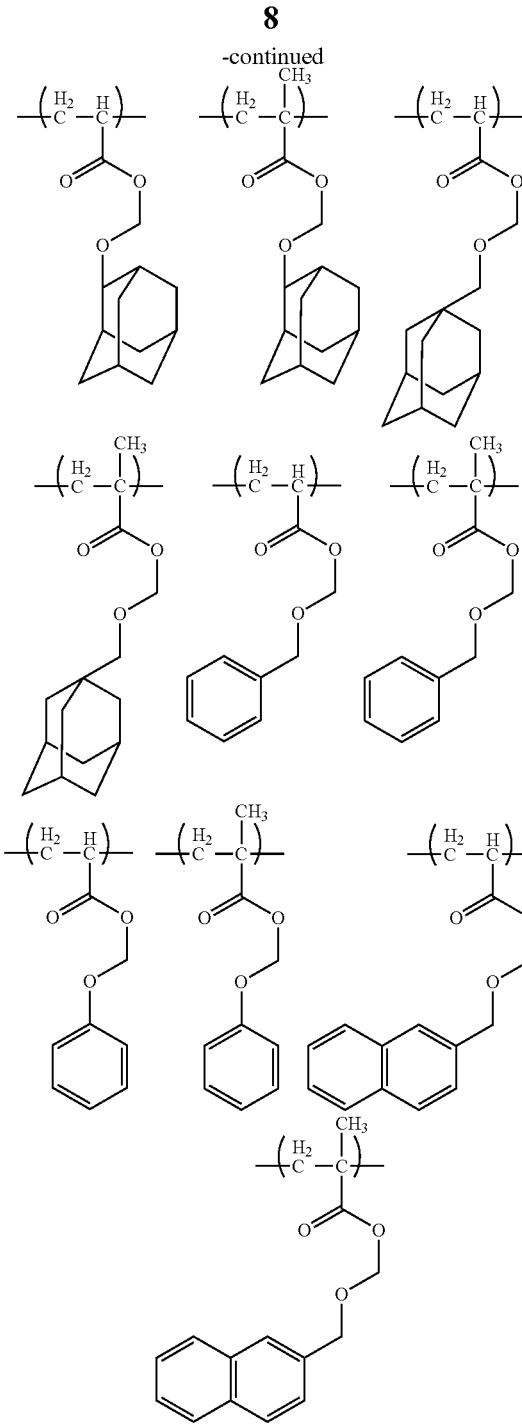

The monomer from which the structural unit represented by formula (I) is derived can be produced in the manner of the method recited in JP-H3-192173A1.

The structural unit represented by formula (I) accounts for usually 5 to 80% by mole, preferably 10 to 70% by mole, more preferably 15 to 60% by mole, of the total structural units of Resin (A1).

Resin (A1) may further have another structural unit (a1) other than the structural unit represented by formula. (I). Preferable examples of another structural unit (a1) include the structural units represented by the formulae (a1-1) and (a1-2):

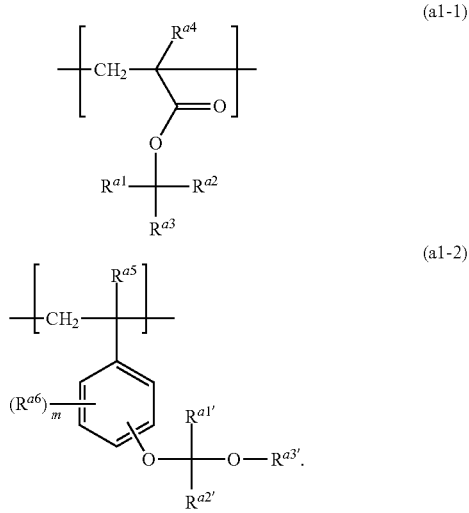

(a1-1)

(a1-2)

The structural units represented by the formulae (a1-1) and (a1-2) are sometimes referred to as "structural unit (a1-1)" and "structural unit (a1-2)", respectively.

In each formula, $R^{a1}$, $R^{a2}$ and $R^{a3}$ each independently represent a C1-C8 alkyl group or a C3 to C20 alicyclic hydrocarbon group, two of $R^{a1}$, $R^{a2}$ and together may represent one C2 to C20 divalent hydrocarbon group where a methylene group can be replaced by an oxygen atom or a sulfur atom, $R^{a1'}$ and $R^{a2'}$ each independently represent a hydrogen atom or a C1 to C12 hydrocarbon group, $R^{a3'}$ represents a hydrogen atom or a C1 to C20 hydrocarbon group, and one of $R^{a1'}$ and $R^{a2'}$ together with $R^{a3'}$ may represent one C1 to C20 divalent heterocyclic group where a methylene group can be replaced by an oxygen atom or a sulfur atom, $R^{a4}$ and $R^{a5}$ each independently represent a hydrogen atom or a methyl group, $R^{a6}$ represents a C1 to C6 alkyl group or a C1 to C6 alkoxy group, and m represents an integer of 0 to 4.

Examples of the alkyl group represented by $R^{a1}$, $R^{a2}$ and $R^{a3}$ include a methyl group, an ethyl group, n-propyl group, isopropyl group, n-butyl group, sec-butyl group, tert-butyl group, n-pentyl group, n-hexyl group, n-pentyl group and n-hexyl group.

Examples of the alicyclic hydrocarbon group represented by $R^{a1}$, $R^{a2}$ and $R^{a3}$ include a monocyclic alicyclic hydrocarbon group such as a cyclopropyl group, a cyclobutyl group, a cyclopentyl group, a cyclohexyl group; and a polycyclic alicyclic hydrocarbon group such as a decahydronaphthyl group, an adamantyl group, and a norbornyl group.

Examples of the hydrocarbon group represented by $R^{a1'}$ or $R^{a2'}$ include a C1 to C12 aliphatic hydrocarbon group, a C6 to C12 aromatic hydrocarbon group, and any combination of them. The aliphatic hydrocarbon group includes a chain aliphatic hydrocarbon group, a cyclic aliphatic hydrocarbon group, and any combination of these aliphatic hydrocarbon groups. The aliphatic hydrocarbon group may have a carbon-carbon double bond, which is preferably a saturated aliphatic hydrocarbon group.

Examples of the chain aliphatic hydrocarbon group include a linear or branched aliphatic hydrocarbon group such as a methyl group, an ethyl group, n-propyl group, isopropyl group, n-butyl group, tort-butyl, sec-butyl, n-pentyl group and n-hexyl group.

Examples of the a c aliphatic hydrocarbon group include a monocyclic alicyclic aliphatic hydrocarbon group such as a cyclopropyl group, a cyclobutyl group, a cyclopentyl group and a cyclohexyl group; and a polycyclic alicyclic hydrocarbon group such as a decahydronaphthyl group, an adamantyl group, and a norbornyl group.

Examples of the aromatic hydrocarbon group include a phenyl group, a naphthyl group and a tolyl group.

Examples of any combination of the above-mentioned hydrocarbon groups include an aralkyl group such as benzyl group.

Examples of the hydrocarbon group represented by $R^{a3'}$ include a C1 to C20 aliphatic hydrocarbon group, a C6 to C20 aromatic hydrocarbon group, and any combination of them.

Examples of the aliphatic hydrocarbon group represented by $R^{a3'}$ include the same one referring to the aliphatic hydrocarbon group represented by $R^2$.

Examples of the aromatic hydrocarbon group represented by $R^{a3'}$ include a phenyl group, a naphthyl group and a phenanthryl group.

$R^{a4}$ is preferably a methyl group.

One of $R^{a1'}$ and $R^{a2'}$ is preferably a hydrogen atom.

The other of $R^{a1'}$ and $R^{a2'}$ preferably a C1 to C12 hydrocarbon group, more preferably a C1 to C12 alkyl group, and still more preferably a methyl group and an ethyl group.

The hydrocarbon group for $R^{a2'}$ includes preferably a C1 to C18 alkyl group, a C3 to C18 alicyclic hydrocarbon group, a C6 to C18 aromatic hydrocarbon group, and a combined group of them, more preferably a C1 to C12 alkyl group, a C3 to C12 alicyclic hydrocarbon group, and a C7 to C18 aralkyl group.

$R^{a5}$ is preferably a hydrogen atom.

$R^{a6}$ is preferably a C1 to C4 alkoxy group, and more preferably a methoxy and ethoxy group, and still more preferably methoxy group.

m is preferably 0 or 1, and more preferably 0.

Examples of the structural unit represented by formula (a1-1) include those represented by formulae (a1-1-1) to (a1-1-17).

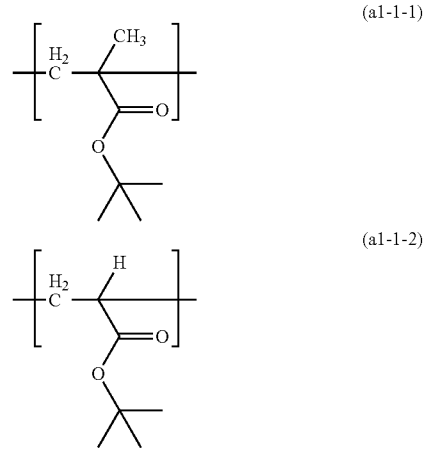

(a1-1-1)

(a1-1-2)

-continued
(a1-1-3)
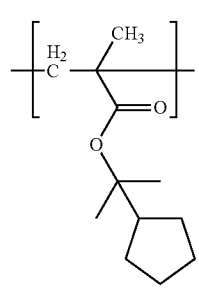
(a1-1-4)
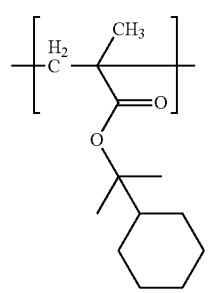
(a1-1-5)
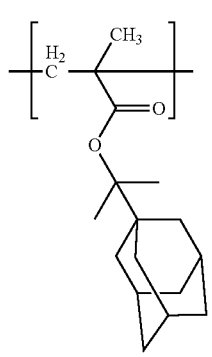
(a1-1-6)
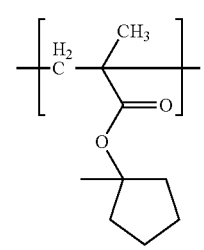
(a1-1-7)
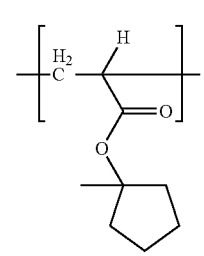
(a1-1-8)
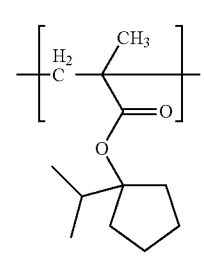
-continued
(a1-1-9)
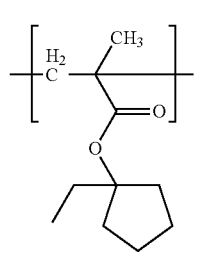
(a1-1-10)
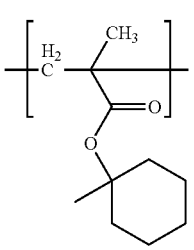
(a1-1-11)
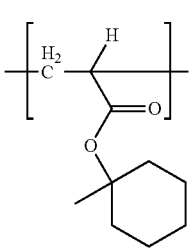
(a1-1-12)
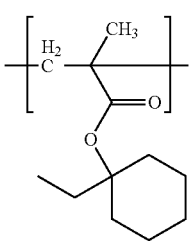
(a1-1-13)
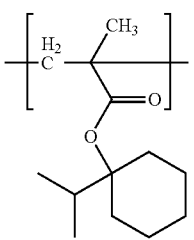
(a1-1-14)
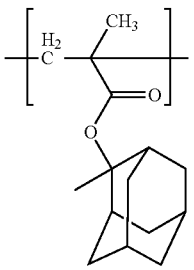

(a1-1-15)
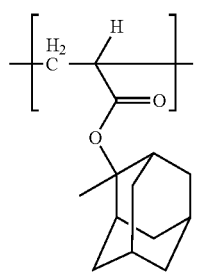
(a1-1-16)
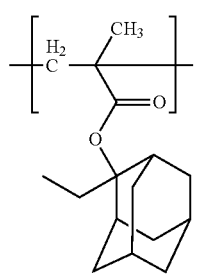
(a1-1-17)
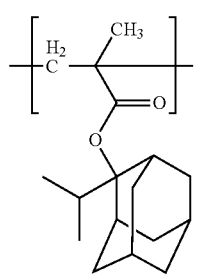
Examples of the structural unit represented by formula (a1-2) include those represented by formulae (a1-2-1) to (a1-2-14).
(a1-2-1)
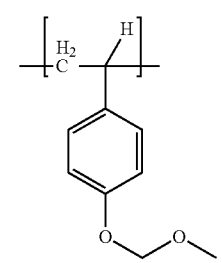
(a1-2-2)
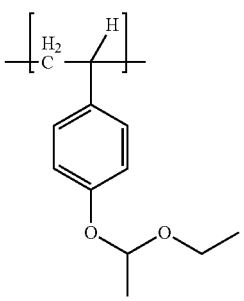
(a1-2-3)
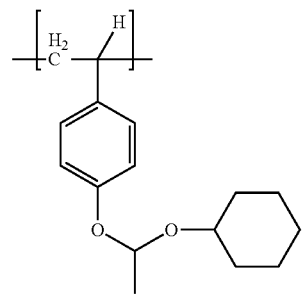
(a1-2-4)
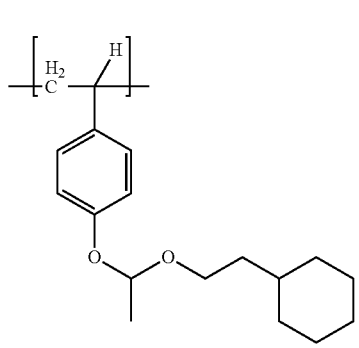
(a1-2-5)
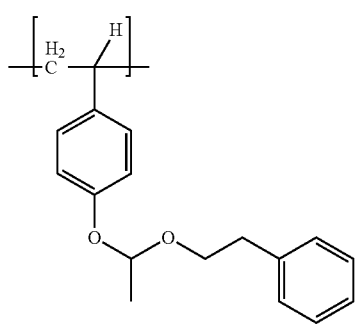
(a1-2-6)
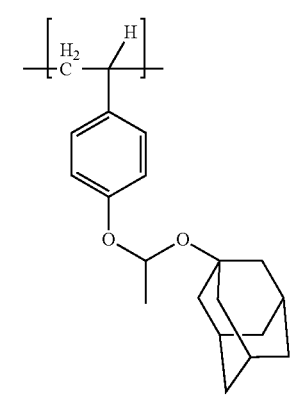
(a1-2-7)
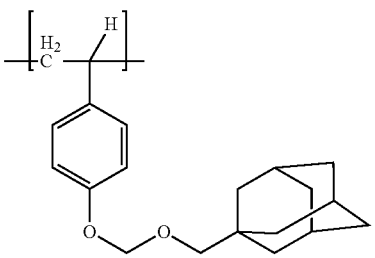

(a1-2-8)
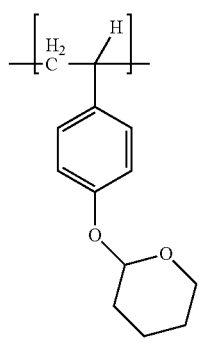

(a1-2-9)
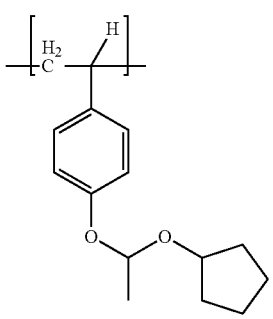

(a1-2-10)
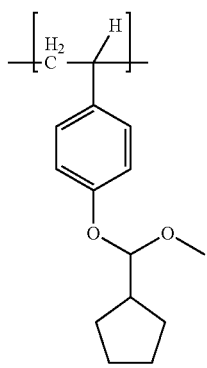

(a1-2-11)
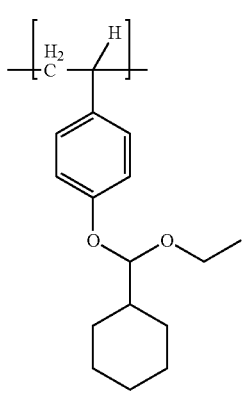

(a1-2-12)
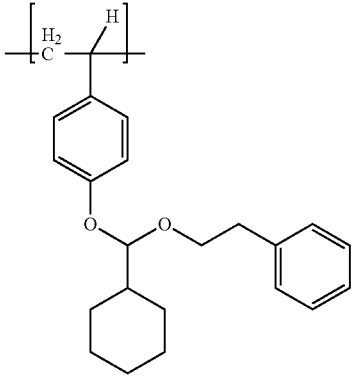

(a1-2-13)
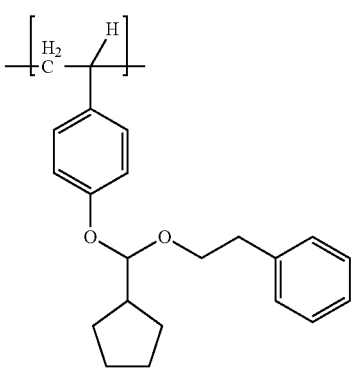

(a1-2-14)
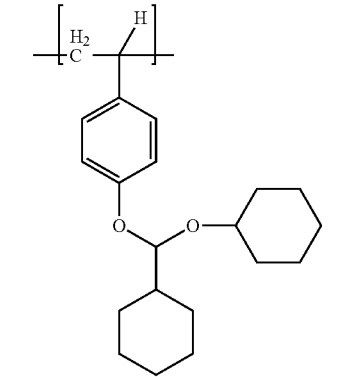

Examples of the structural unit represented by formula (a1-2) also include those represented by any one of formulae (a1-2-1) to (a1-2-14-) where the hydrogen atom represented by $R^{a4}$ and $R^{a5}$ has been replaced by a methyl group.

The structural unit represented by formula (a1-2) is preferably one represented by any one of formulae (a1-2-2) (a1-2-3) (a1-2-4) (a1-2-9) and (a1-2-14), more preferably one represented by any one of formulae (a1-2-2), (a1-2-3), (a1-2-4) and (a1-2-9).

Resin (A1) preferably comprises the structural unit represented by formula (a1-2).

When Resin (A1) comprises the structural unit represented by formula (a1-1) and/or formula (a1-2), the total content of these structural units is usually 1 to 60% by mole and preferably 3 to 50% by mole, more preferably 5 to 40% by mole, based on total molar of all the structural units of the resin.

<Structural Unit Having No Acid-labile Group>

Resin (A1) may further have a structural unit having no acid-labile group (which structural unit is sometimes referred to as "structural unit (a2)"). Resin (A1) may further have two or more of structural units (a2).

Examples of the structural unit (a2) include those represented by formulae (a2-1), (a2-2) and (a2-3):

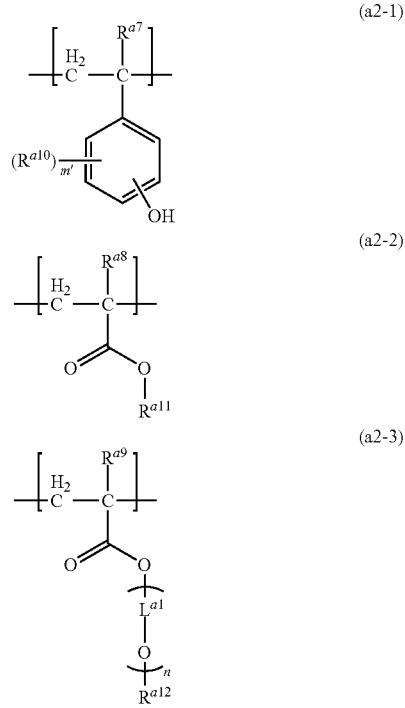

wherein $R^{a7}$, $R^{a8}$ and $R^{a9}$ independently represent a hydrogen atom or a methyl group, $R^{a10}$ represents a C1 to C6 alkyl group or a C1 to C6 alkoxy group, m' represents an integer of 0 to 4, $R^{a11}$ represents a hydrogen atom or a C1 to C20 primary or secondary hydrocarbon group, $R^{a12}$ represents a C1 to C6 primary or secondary alkyl group, $L^{a1}$ each independently represents a C2 to C6 alkanediyl group where the carbon atom at the first or second position is bonded to an oxygen atom, and n represents an integer of 1 to 30.

Examples of the alkyl group represented by $R^{a10}$ or $R^{a12}$ include a methyl group, an ethyl group, a n-propyl group, an isopropyl group, an n-butyl group, a tert-butyl group, a sec-butyl group, a n-pentyl group and a n-hexyl group.

Examples of the alkoxy group represented by $R^{a10}$ include a methoxy group, an ethoxy group, a propoxy group, an isopropoxy group, a butoxy group, a n-pentyloxy group and a n-hexyloxy group.

Examples of the hydrocarbon group represented by $R^{a11}$ include a C1 to C20 aliphatic hydrocarbon group, a C6 to C20 aromatic hydrocarbon group, and any combination of these hydrocarbon groups.

The aliphatic hydrocarbon group maybe a chain or cyclic aliphatic hydrocarbon group.

Examples of the chain aliphatic hydrocarbon group include a C1 to C20 linear aliphatic hydrocarbon group such as a methyl group, an ethyl group, n-propyl group, n-butyl group, n-pentyl group and n-hexyl group, n-heptyl group, n-octyl group, n-nonyl group and n-decanyl group; and a C3 to C20 branched aliphatic hydrocarbon group such as 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, and 4-methylpentyl group.

The cyclic aliphatic hydrocarbon group may be a monocyclic or polycyclic one.

Examples of the monocyclic aliphatic hydrocarbon group include a cycloalkyl group such as a cyclopentyl group, a cyclohexyl group, a cycloheptyl group, and a cyclooctyl group.

Examples of the polycyclic aliphatic hydrocarbon group include polycyclic alicyclic hydrocarbon groups such as a decahydronaphthyl group, an adamantyl group, a norbornyl group and the following ones:

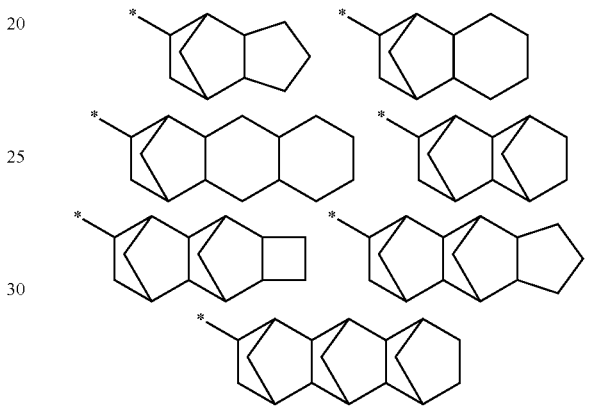

Examples of the aromatic hydrocarbon group include a phenyl group and a naphtyl group.

Examples of the combination of the chain aliphatic hydrocarbon group and the aromatic hydrocarbon group include an aralkyl group such as benzyl group.

Examples of the alkanediyl group include a linear or branched alkanediyl group such as an ethylene group, a propane-1,3-diyl group, a propane-1,2-diyl group, a butane-1,4-diyl group, a pentane-1,5-diyl group, a hexane-1,6-diyl group, an ethane-1,1-diyl group, a propane-1,1-diyl group and a propane-2,2-diyl group, a propane-1,2-diyl group, pentane-2,4-diyl group, 2-methylpropane-1,3-diyl group, pentane-1,4-diyl group, and 2-methylbutane-1,4-diyl group.

$R^{a7}$ preferably represents a hydrogen atom.

Preferably, $R^{a8}$ and $R^{a9}$ each independently represent a methyl group.

$R^{a10}$ represents preferably a C1 to C4 alkoxy group, more preferably a methoxy group or an ethoxy group, and still more preferably a methoxy group.

m' represents preferably an integer of 0 or 1, more preferably an integer of 0.

$R^{a11}$ represents preferably a C1 to C6 primary or secondary alkyl group.

$L^{a1}$ represents preferably a C2 to C4 alkanediyl group such as an ethane-1,2-diyl group, a propane-1,3-diyl group and a butane-1,2-diyl group, more preferably an ethane-1,2-diyl group.

n represents preferably an integer of 1 to 10, more preferably 2 to 10.

$R^{a12}$ represents preferably a C1 to C3 primary or secondary alkyl group.

Examples of the structural unit represented by formula (a2-1) include those represented by formulae (a2-1-1), (a2-1-2), (a2-1-3) and (a2-1-4).

The monomers from which the structural units represented by formula (a2-1) are derived are mentioned in JP2010-204634A1.

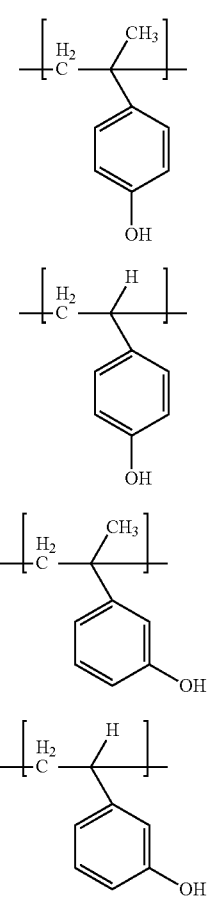

Examples of the monomers from which the structural units represented by formula (a2-2) are derived include acrylate, methacrylate, alkyl(meth)acrylates such as methyl (meth)acrylate, ethyl(meth)acrylate, propyl(meth)acrylate, butyl(meth)acrylate, hexyl(meth)acrylate, cycloalkyl(meth) acrylates such as cyclopentyl(meth)acrylate and cyclohexyl (meth)acrylate, polycyclic(meth)acrylates such as adamantyl(meth)acrylate, and aryl(meth)acrylates such as phenyl (meth)acrylate and aralkyl(meth)acrylates such as benzyl (meth)acrylate. Herein, "(meth)acrylate" includes acrylate and methacrylate.

Examples of the monomers from which the structural units represented by formula (a2-3) are derived include (meth)acrylates such as ethyleneglycolmonomethylether (meth)acrylate, ethyleneglycolmonoethylether (meth)acrylate, ethyleneglycolmonopropylethylether (meth)acrylate, ethyleneglycolmonobuthylether (meth)acrylate, diethyleneglyrolmonomethylether (meth)acrylate, triethyleneglycolmonomethylether (meth)acrylate, tetraethyleneglycolmonomethylether (meth)acrylate, pentaethyleneglycolmonomethylether (meth)acrylate, hexaethyleneglycolmonomethylether (meth)acrylate, nonaethyleneglycolmonomethylether (meth)acrylate, and octaethyleneglycolmonomethylether (meth)acrylate.

Other examples of the monomers from which the structural unit having no acid-labile group is derived include crotonic acid, 2-hydroxyethyl(meth)acrylate, 2-hydroxypropyl(meth)acrylate, styrene, α-methylstyrene, 4-methylstyrene, 2-methylstyrene, 3-methylstyrene, 4-methoxystyrene, and 4-isopropoxystyrene.

Examples of the structural unit (a2) further include those represented by formula (a2-4):

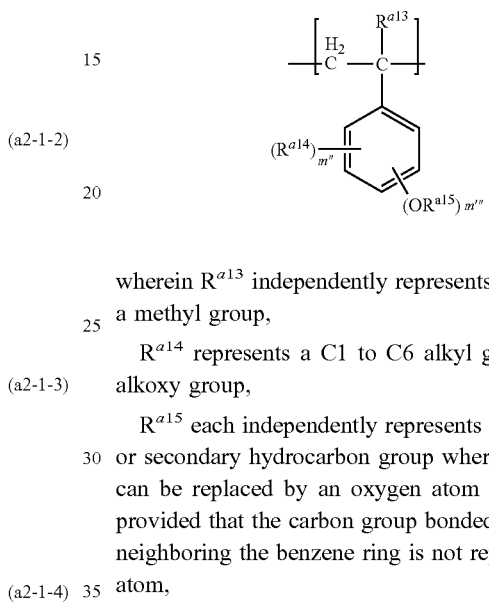

wherein $R^{a13}$ independently represents a hydrogen atom or a methyl group, $R^{a14}$ represents a C1 to C6 alkyl group or a C1 to C6 alkoxy group, $R^{a15}$ each independently represents a C1 to C12 primary or secondary hydrocarbon group where a methylene group can be replaced by an oxygen atom or a carbonyl group provided that the carbon group bonded to the oxygen atom neighboring the benzene ring is not replaced by an oxygen atom, m" and m'" each independently represent an integer of 0 to 4 provided that the sum of them is 5 or less.

Examples of the alkyl group and the alkoxy group each represented by $R^{a14}$ include those represented by $R^{a10}$.

Examples of the hydrocarbon group each represented by $R^{a15}$ include those represented by $R^{a11}$.

$R^{a15}$ preferably represents a C1 to C5 linear or branched alkyl group, a C5 to C10 alicyclic hydrocarbon group, a phenyl group, or any combination of these groups. In these preferable groups, the methylene group bonded to the oxygen atom neighboring the benzene ring can be replaced by a carbonyl group.

Examples of the structural unit represented by formula (a2-4) include those represented by formulae (a2-4-1) to (a2-4-10).

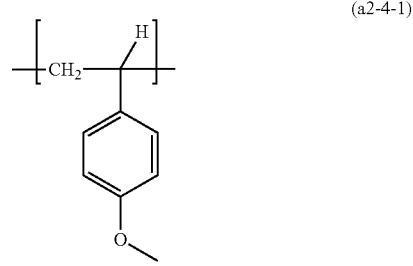

(a2-4-2) 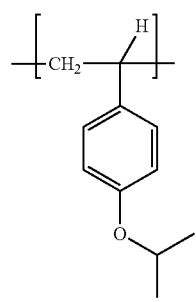

(a2-4-3) 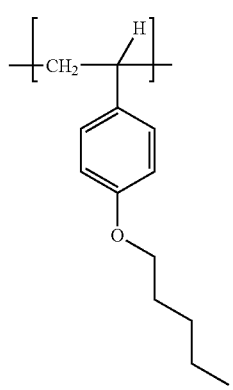

(a2-4-4) 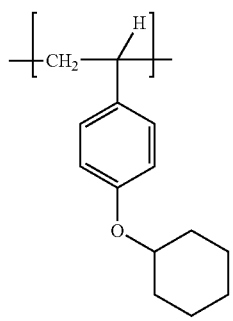

(a2-4-5) 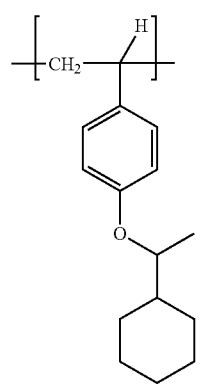

(a2-4-6) 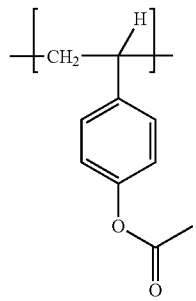

(a2-4-7) 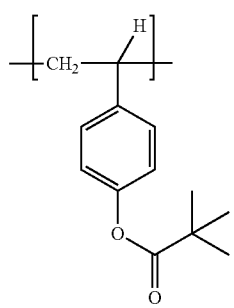

(a2-4-8) 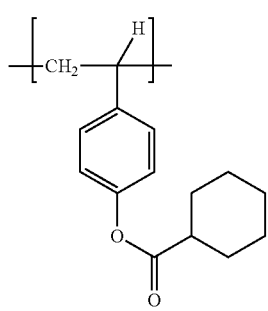

(a2-4-9) 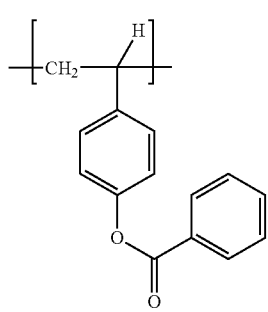

(a2-4-10) 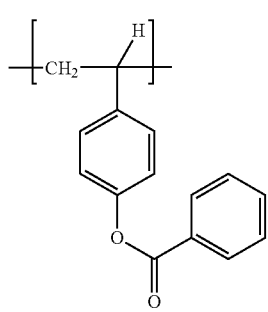

Examples of the structural unit represented by formula (a2-4) also include those represented by the formulae where the hydrogen atom corresponding $R^{a13}$ been replaced by a methyl group.

Another example of the structural unit (a2) includes those having no acid-labile group but a lactone ring.

Examples of the structural unit having no acid-labile group but a lactone ring include the structural units derived from a monomer described in JP2010-204646A1, the structural units derived from a monomer described in JP2000-122294A1, and the structural units derived from a monomer described in JP2012-41274A1, and specific examples of which include the following ones.
(a3-1-1)
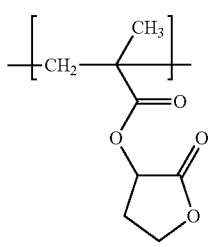
(a3-1-2)
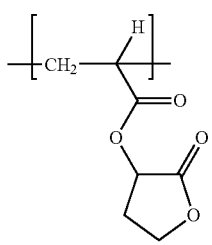
(a3-1-3)
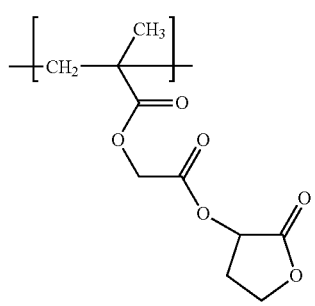
(a3-1-4)
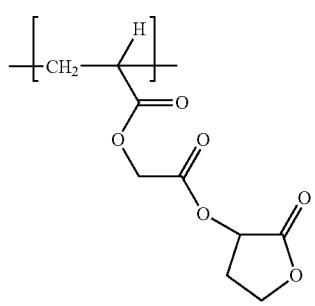
(a3-2-1)
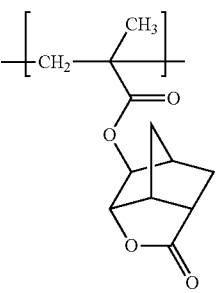
-continued
(a3-2-2)
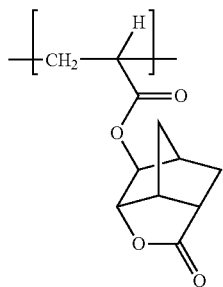
(a3-2-3)
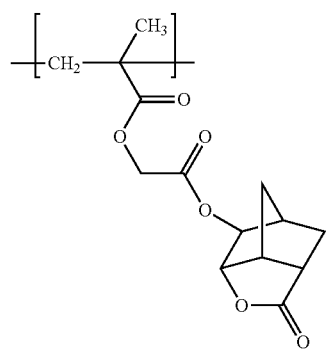
(a3-2-4)
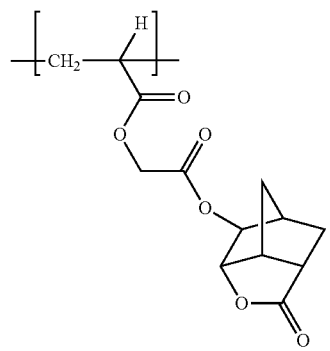
(a3-3-1)
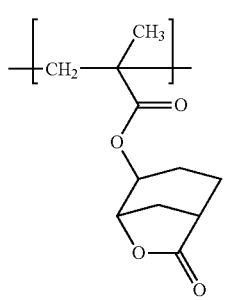
(a3-3-2)
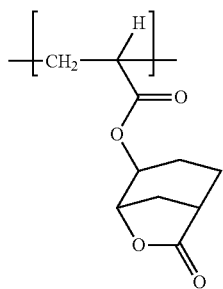

-continued (a3-3-3)
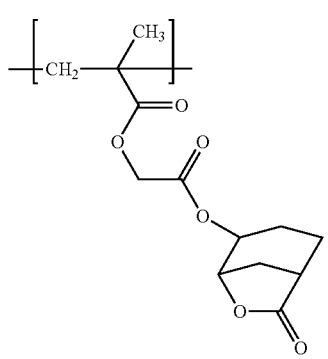

(a3-3-4)
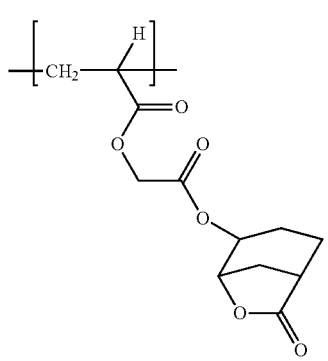

When Resin (A1) has the structural unit (a2), the content of the structural unit accounts for preferably 1 to 80% by mole, more preferably 3 to 70% by mole, and still more preferably 5 to 60% by mole of all the structural units of Resin (A1). Resin (A1) preferably has a structural unit represented by formula (I) and a structural unit selected from the group consisting of a structural unit represented by formula (a2-1) a structural unit represented by formula (a2-2), a structural unit represented by formula (a2-3) and a structural unit having a lactone ring and no acid-labile group, more preferably has a structural unit represented by formula (I) and a structural unit selected from the group consisting of a structural unit represented by formula (a2-3) and a structural unit having a lactone ring and no acid-labile group, and still more preferably has a structural unit represented by formula (I) and a structural unit having a lactone ring and no acid-labile group.

The weight average molecular weight of polymer (I) is usually 3000 or more, preferably 5000 or more, while it is usually 100000 or less, preferably 50000 or less.

The weight average molecular weight is determined by gel permeation chromatography analysis using standard polystyrene as a standard reference material, as described later in Examples.

Specific examples of Resin (A1) include those represented by formulae (A1-1a) to (A1-27a)

(A1-1a)
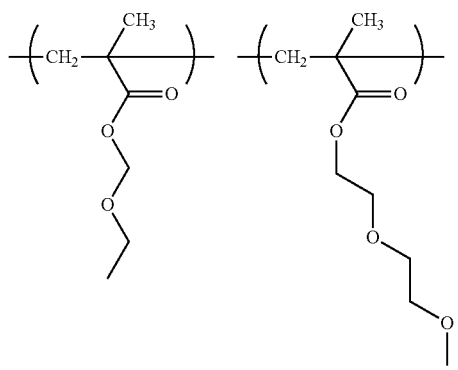

(A1-2a)
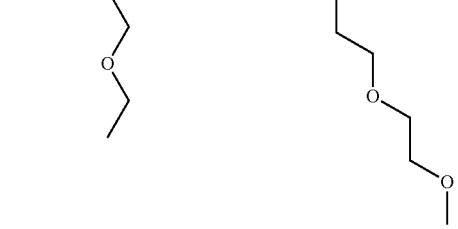

(A1-3a)
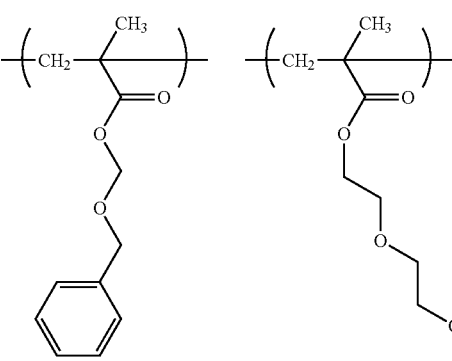

(A1-4a)
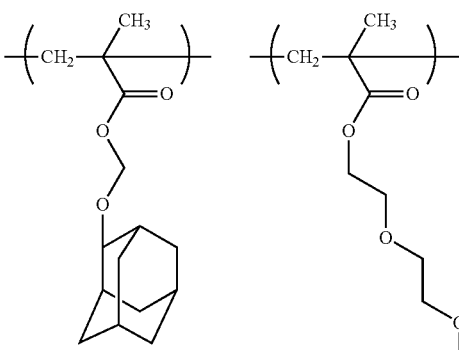

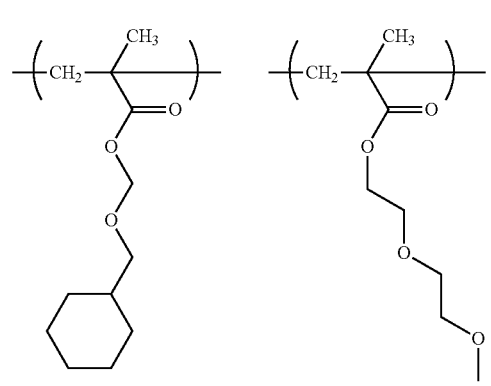
(A1-5a)
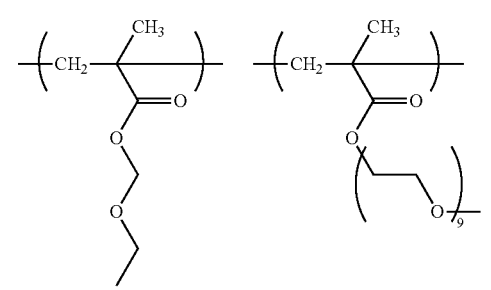
(A1-6a)
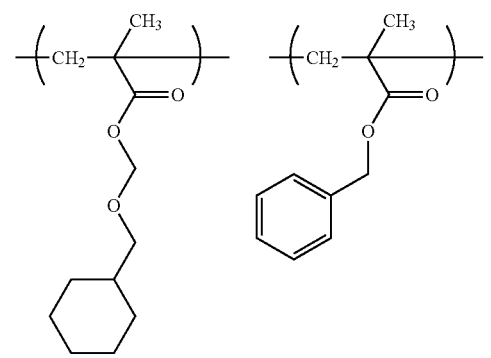
(A1-7a)
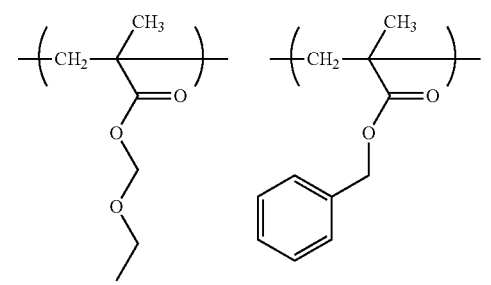
(A1-8a)
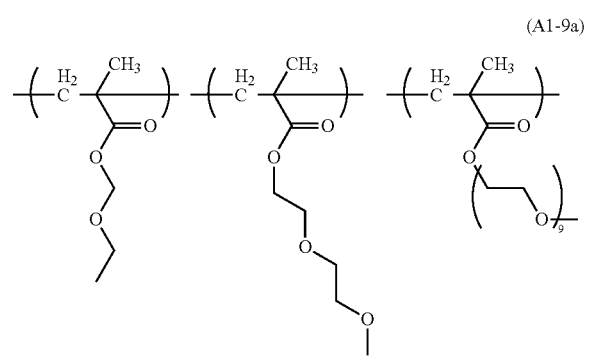
(A1-9a)
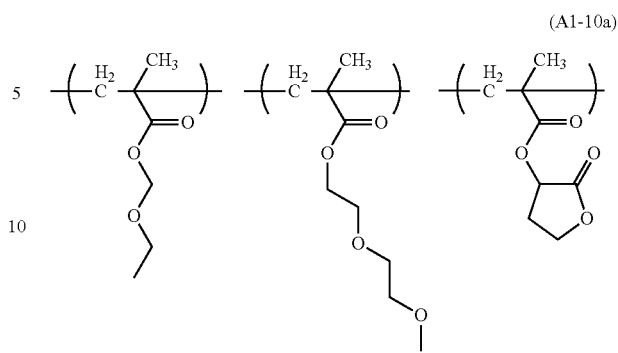
(A1-10a)
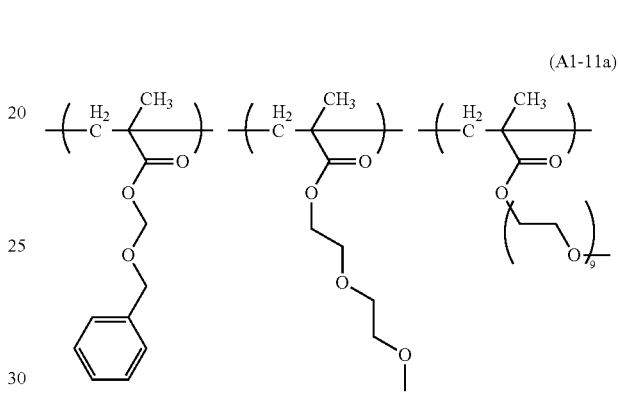
(A1-11a)
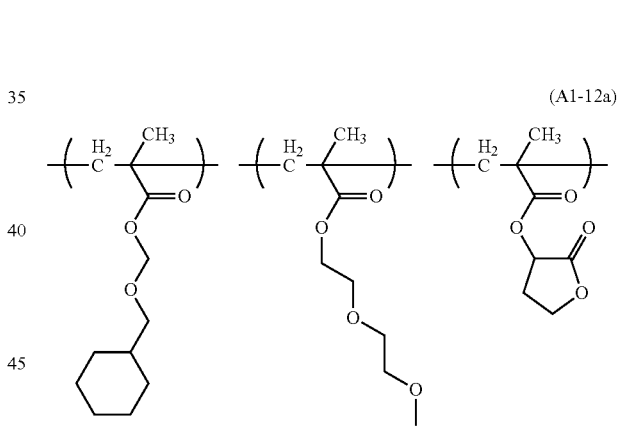
(A1-12a)
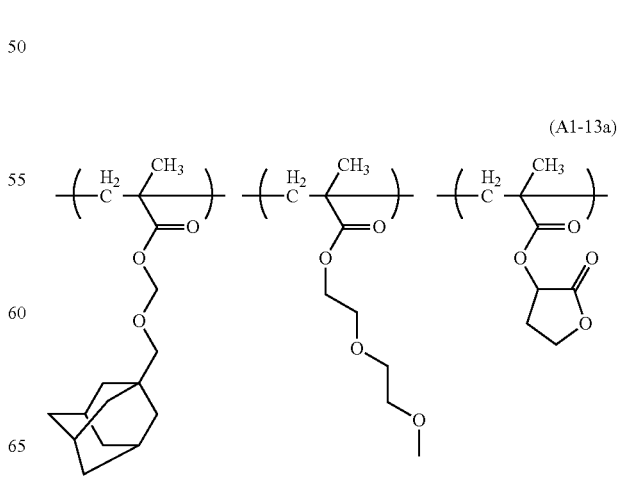
(A1-13a)

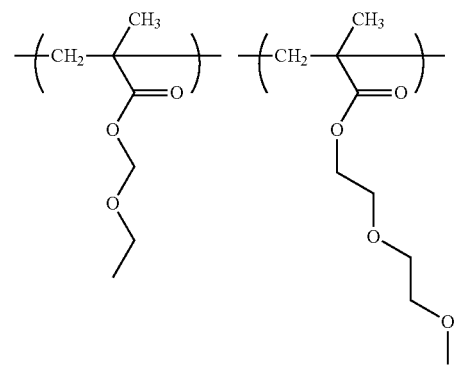
(A1-14a)
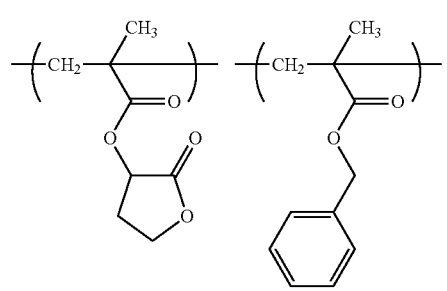
(A1-15a)
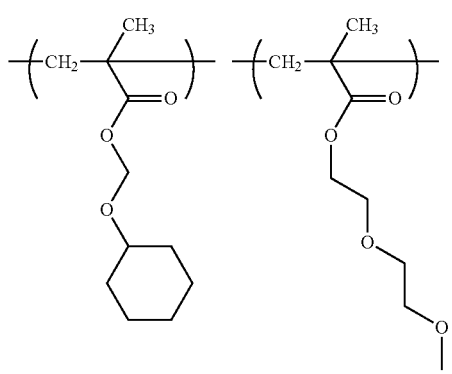
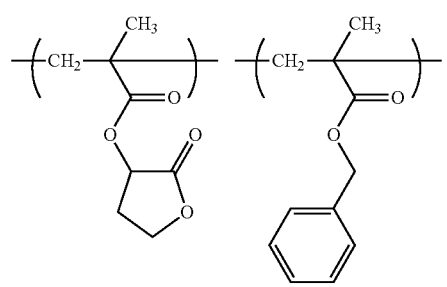
(A1-16a)
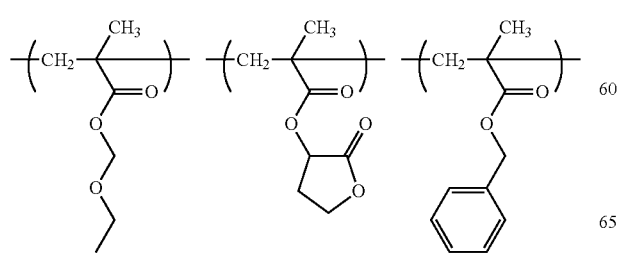
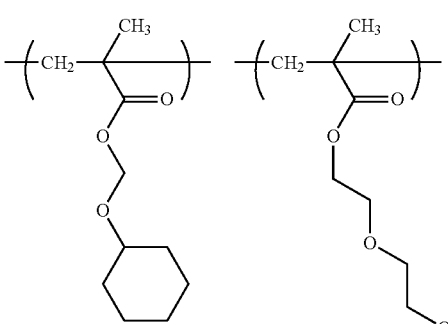
(A1-17a)
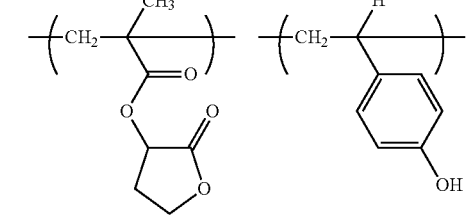
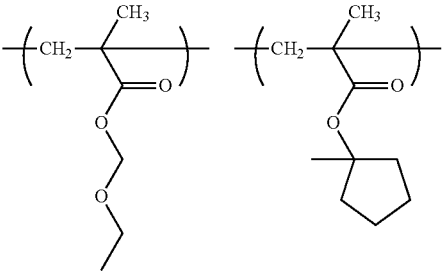
(A1-18a)
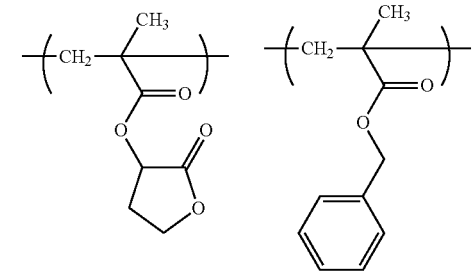
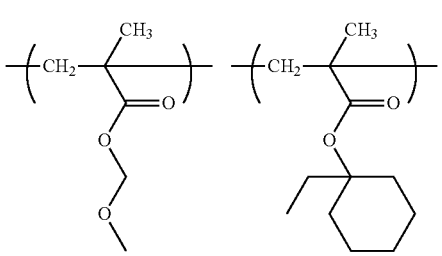
(A1-19a)
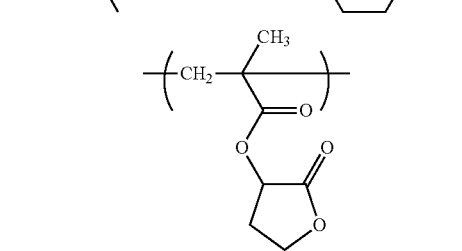

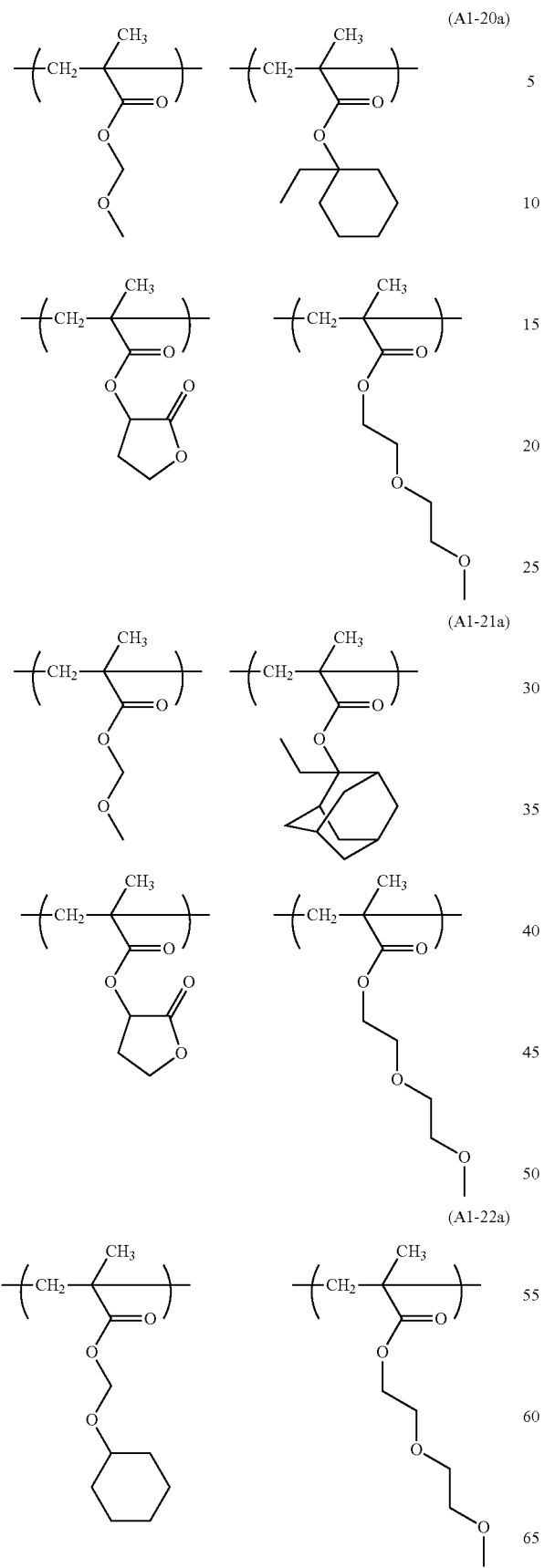
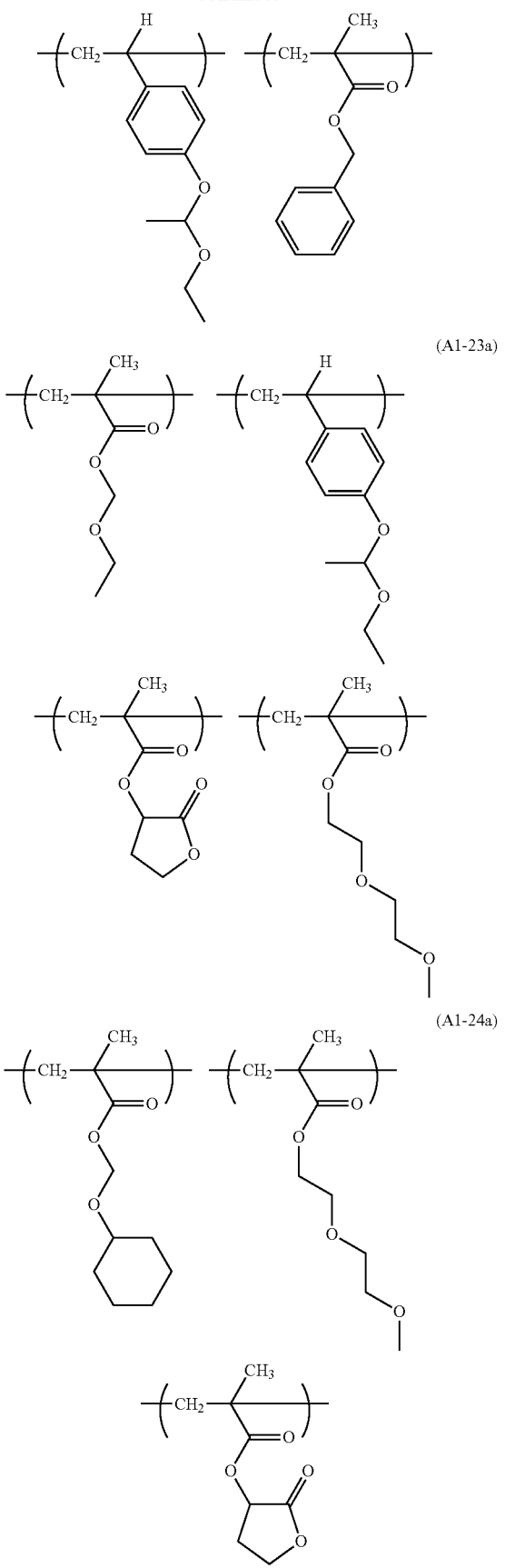

-continued (A1-25a)
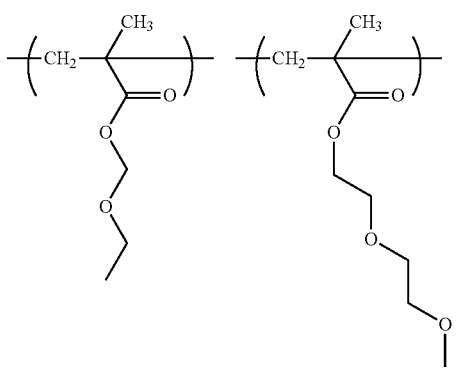

(A1-26a)
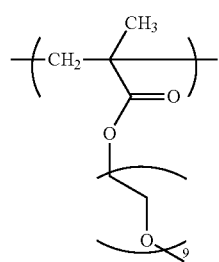

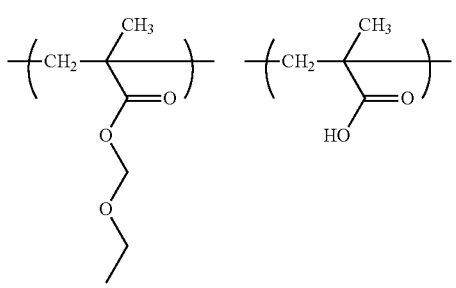

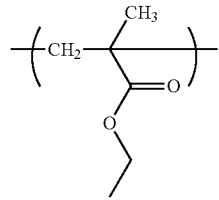

(A1-27a)
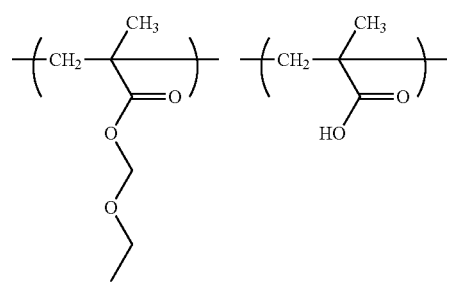

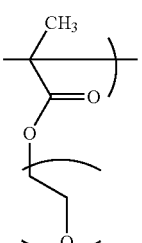

Among the compounds represented by formulae (A1-1a) to (A1-27a) those represented by formulae (A1-1a), (A1-10a), (A1-14a) and (A1-24a) (A1-27a) are preferred.

The content of Resin (A1) in the photoresist composition is preferably 5% by mass or more, and preferably 10% by mass or more, of the total amount of solid components.

The content of Resin (A1) is preferably 80% by mass or less, more preferably 70% by mass or less, of the total amount of solid components.

In this specification, "solid components" means components other than solvent in the photoresist composition.

Resin (A1) can be produced by polymerizing the above-mentioned monomers in a known manner such as radical polymerization.

<Resin (A2)>

The photoresist composition of the present invention further comprises Resin (A2), an alkaline-soluble resin.

The alkaline-soluble resin means a resin which comprises an acid group and soluble in an alkaline developer. The acid group includes a carboxy group, a sulfo group, or a phenolic-hydroxy group.

Examples of the alkaline-soluble resin include an alkaline-soluble resin known in the art of photoresists such as novolak resin, a resin consisting of a structural unit derived from hydroxystyrene, a resin having no acid-labile group but a structural unit derived from (meth)acrylic ester, and poly-alkyleneglycols. The photoresist composition of the present invention may further contain two or more kinds of Resin (A2).

As the alkaline-soluble resin, a novolak resin is preferred. The novolak resin is a resin obtained by condensing a phenol compound with an aldehyde in the presence of a catalyst.

Examples of the phenolic compound include phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 5-methylphenol, 2-, 4- or 5-methylresorcinol, 2-, 3- or 4-methoxyphenol, 2,3-, 2,5- or 3,5-dimethoxyphenol, 2-methoxyresorcinol, 4-t-butylcatechol, 2-, 3- or 4-ethylphenol, 2,5- or 3,5-diethylphenol, 2,3,5-triethylphenol, 2-naphthol, 1,3-, 1,5- or 1,7-dihydroxynaphthalene, and polyhydroxytriphenylmethane compounds obtained by condensing xylenol with hydroxybenzaldehyde. One or more of these phenolic compounds can be used for producing a novolak resin.

Among them, the phenolic compound is preferably o-cresol, m-cresol, p-cresol, 2,3-xylenol, 2,5-xylenol, 3,5-xylenol, 2,3,5-trimethylphenol, 2-t-butylphenol, 3-t-butylphenol, 4-t-butylphenol, 2-t-butyl-4-methylphenol or 2-t-butyl-5-methylphenol.

Examples of the aldehyde include aliphatic aldehydes such as formaldehyde, acetaldehyde, propionaldehyde, n-butyraldehyde, isobutyraldehyde, acrolein or croton aldehyde; alicyclic aldehydes such as cyclohexanealdehyde, cyclopentanealdehyde, furfural, and furanacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde or o-, m- or p-hydroxybenzaldehyde; and aromatic aliphatic aldehydes such as phenylacetaldehyde or cinnamaldehyde.

One or more of these aldehydes can be used for producing a novolak resin. Among them, formaldehyde is preferred in view of easy industrial availability.

The catalyst for condensation of a phenolic compound and an aldehyde includes inorganic acids such as hydrochloric acid, sulfuric acid, perchloric acid or phosphoric acid; organic acid such as formic acid, acetic acid, oxalic acid, trichloroacetic acid or p-toluenesulfonic acid; divalent metal salts such as zinc acetate, zinc chloride or acetic acid magnesium.

One or more of these catalysts can be used for producing a novolak resin. The amount of the catalyst to be used is usually from 0.01 to 1 mole per mole of aldehyde.

The condensation of a phenolic compound and an aldehyde can be conducted by mixing a phenolic compound and an aldehyde, followed by reacting them at the temperature in the range of 60° C. to 120° C. for 2 to 30 hours. The condensation can be conducted in the presence of a solvent such as methylethylketone, methylisobuthylketone and acetone. After the reaction, novolak resins can be collected by adding a solvent insoluble in water to the reaction mixture, washing the mixture with water, followed by condensing it.

The weight average molecular weight of the novolak resin is usually 3000 or more, preferably 4000 or more, and more preferably 5000 or more, while it is usually 50000 or less, preferably 40000 or less, and more preferably 30000 or less. If the photoresist composition comprises the novolak resin the weight average molecular weight of which is within the above-mentioned range, the composition can effectively provide a film which is less likely to become thinner and less likely to give residues.

The weight average molecular weight is determined by gel permeation chromatography analysis using standard polystyrene as a standard reference material, as described later in Examples.

Examples of the resin consisting of a structural unit derived from hydroxystyrene include typically a poly(vinylphenol), specifically poly(p-vinylphenol). Specific examples of the resin include which consists of the structural units (a2-1).

Such poly(vinylphenol) can be produced by polymerizing a vinylphenol monomer recited in JP2010-204634A1.

Examples of the resin having no acid-labile group but a structural unit derived from (meth)acrylate include resin produced by polymerizing (meth)acrylic acid, 2-hydroxyethyl(meth)acrylate, 2-hydroxypropyl(meth)acrylate, or polyethyleneglycol monomethylether (meth)acrylate such as diethyleneglycolmonomethylether (meth)acrylate, triethyleneglycolmonomethylether (meth)acrylate, tetraethyleneglycolmonomethylether (meth)acrylate, pentaethyleneglycolmonomethylether (meth)acrylate, hexaethyleneglycolmonomethylether (meth)acrylate, heptaethyleneglycolmonomethylether (meth)acrylate, octaethyleneglycolmonomethylether (meth)acrylate, and nonaethyleneglycolmonomethylether (meth)acrylate.

Examples of Resin (A2) further include those produced by polymerizing the monomer as mentioned above, in combination with alkyl(meth)acrylates such as methyl (meth)acrylate, ethyl(meth)acrylate, or tert-butyl(meth)acrylates, cycloalkyl(meth)acrylates such as cyclopentyl (meth)acrylates, or cyclohexyl(meth)acrylate, polycyclic (meth)acrylates such as adamantyl(meth)acrylate, ethyleneglycolmonomethylether(meth)acrylate, ethylene glycolmonoethylether(meth)acrylate, ethyleneglycolmonopropylether(meth)acrylate, ethyleneglycolmonobutylether (meth)acrylate and ethyleneglycolmonoalkylether(meth)acrylate.

The content of Resin (A2) in the photoresist composition of the present invention is preferably 10% by mass or more, more preferably 20% by mass or more, and preferably 70% by mass or less, more preferably 65% by mass or less, of the total amount of resin in the photoresist composition.

<Resin (A3)>

The photoresist composition of the invention may further contain Resin (A3), that is resin other than resin (A1) and resin (A2). Examples of Resin (A3) include resin which has another structural unit (a1) than the structural unit (I).

Examples of Resin (A3) include resin which has the structural unit represented by formula (A1-2) as mentioned above but no structural unit (I).

Specific examples of Resin (A3) include resins which have structural units represented by formula (A3-1a) and (A3-1) to (A3-19).

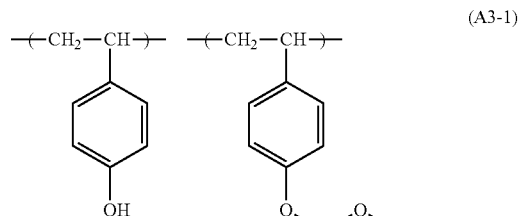

(A3-1)

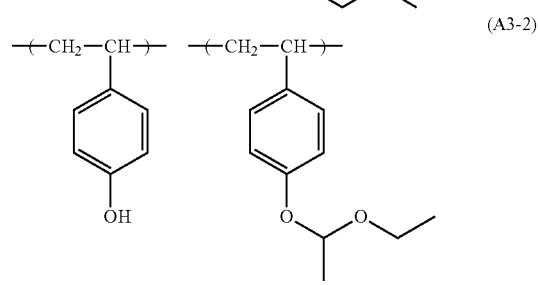

(A3-2)

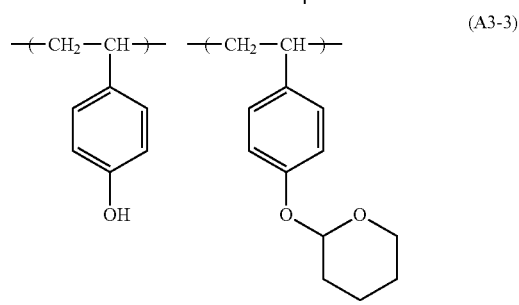

(A3-3)

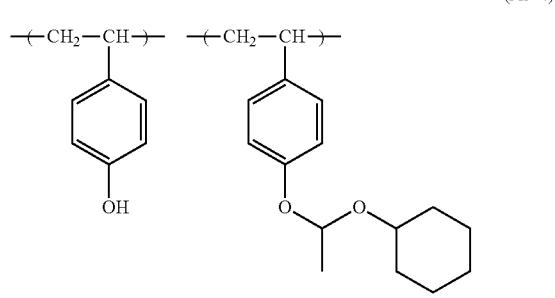

(A3-4)

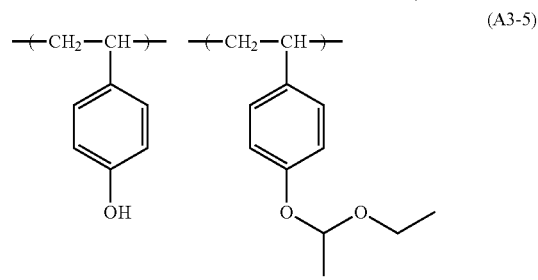

(A3-5)

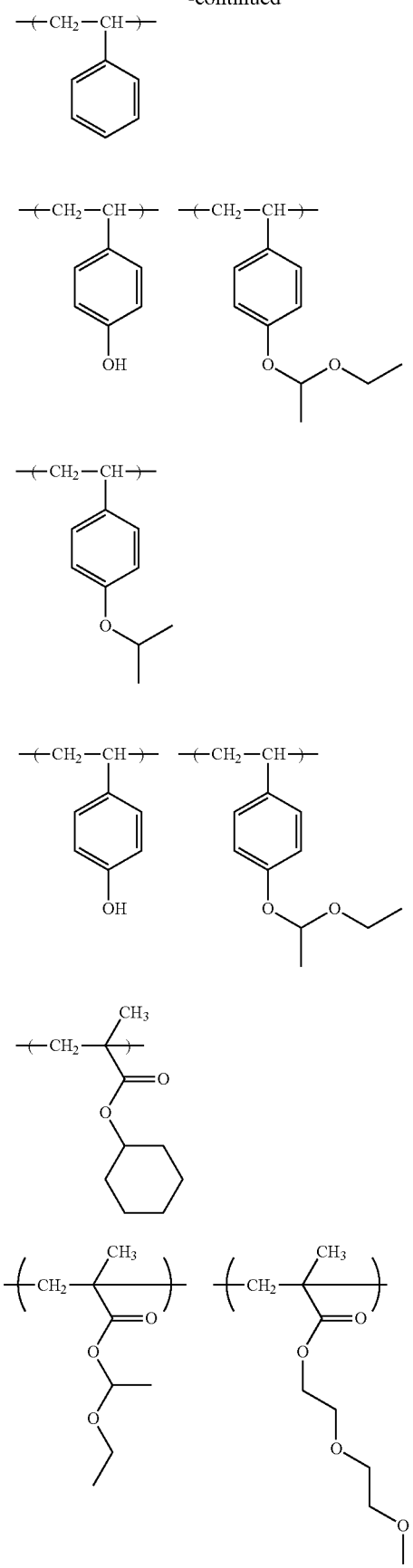
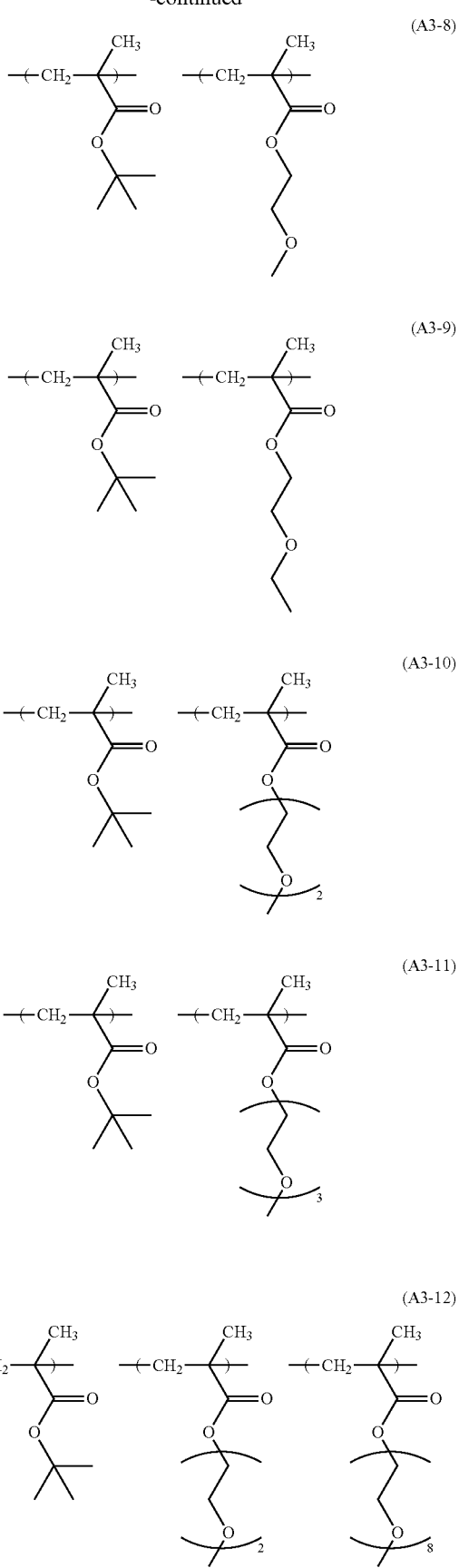

-continued (A3-13)
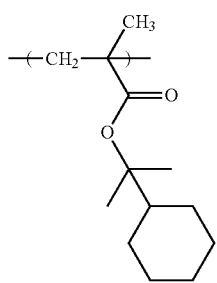 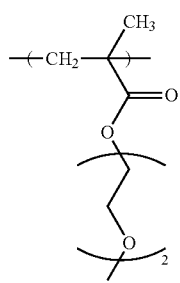

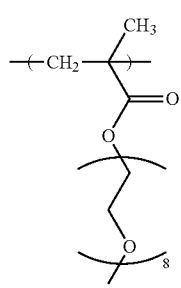

(A3-14)

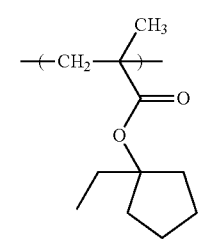

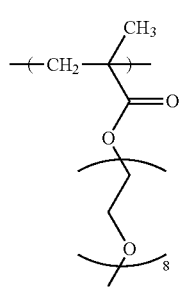

(A3-15)
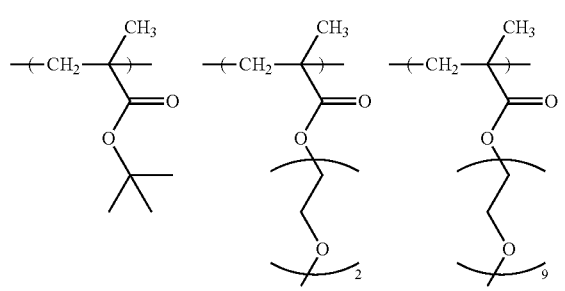

(A3-16)
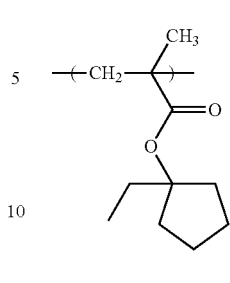

(A3-17)
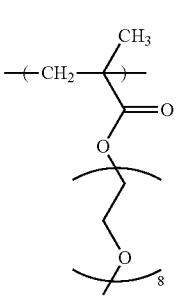

(A3-18)
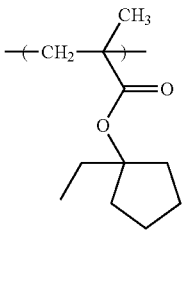

(A3-19)
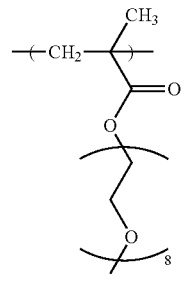

Examples of Resin (A3) include preferably resins which have structural units represented by formula (A3-2), (A3-3), (A3-4), (A3-5), (A3-6), (A3-7), (A3-14), (A3-15), (A3-16), (A3-17), (A3-18) or (A3-19), more preferably resins which have structural units represented by formula (A3-2), (A3-3), (A3-4), (A3-5), (A3-6) or (A2-7).

Resin (A3) can be produced by polymerizing the above-mentioned monomers in a known manner such as radical polymerization.

The weight average molecular weight of polymer (A3) is usually 8000 or more, preferably 10000 or more, while it is usually 600000 or less, preferably 500000 or less.

The weight average molecular weight is determined by gel permeation chromatography analysis using standard polystyrene as a standard reference material.

When the photoresist composition comprises Resin (A3), the content of it is preferably 1% by mass or more, more preferably 2% by mass or more, and still more preferably 3% by mass or more, and preferably 70% by mass or less, more preferably 60% by mass or less, still more preferably 55% by mass or less, further still more preferably 20% by mass or less of the total amount of resin in the photoresist composition.

The total content of Resin (A1), Resin (A2) and Resin (A3) is preferably 80% by mass or more, more preferably 90% by mass or more, and preferably 99% by mass or less of the total amount of solid components in the photoresist composition.

In this specification, "solid components" means components other than solvent in the photoresist composition.

Each component of the photoresist composition is determined in a known manner such as liquid chromatography analysis or gas chromatography analysis.

<Acid Generator (B)>

The photoresist composition of the present invention comprises an acid generator (B).

The acid generator is a compound which can be decomposed by light or radiation to generate an acid. The acid generators may be either ionic or non-ionic one. The acid generator can be used singly or in combination of two or more thereof.

The non-ionic acid generator includes organic halides, sulfonate esters (e.g., 2-nitrobenzoate, aromatic sulfonate, oxime sulfonate, N-sulfonyloxylmide, N-sulfonyloxylmide, sulfonyl oxyketone, diazonaphthoquinone 4-sulfonate) and sulfone (e.g., disulfone, ketosulfone, sulfonyldiazomethane). The ionic acid generator includes an onium salt comprising an onium cation (e.g., a diazonium salt, a phosphonium salt, a sulfonium salt, an iodonium salt). Anions of the onium salts include a sulfonic acid anion, a sulfonylimide anion and a sulfonylmethide anion.

The acid generator (B) includes compounds which generate an acid upon radiation, which are described in JP63-26653A1, JP 55-164824A1 JP62-69263A1, JP63-146038A1, JP63-163452A1, JP 62-153853A1, JP63-146029A1, U.S. Pat. No. 3,779,778, 3,849,137, German patent No. 3914407 and European patent No. 126712.

The acid generator is preferably a compound which has a structure represented by formula (B1).

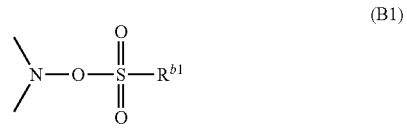

(B1)

where $R^{b1}$ represents a C1-C18 hydrocarbon group which optionally has a fluorine atom and in which a methylene group optionally has been replaced by an oxygen atom or a carbonyl group.

Examples of the acid generator include the compounds represented by formulae (b1), (b2) and (b3). Among them, the acid generator is preferably the compounds represented by formulae (b1) and (b2), more preferably the compounds represented by formula (b1).

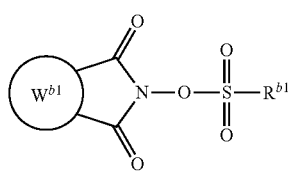

(b1)

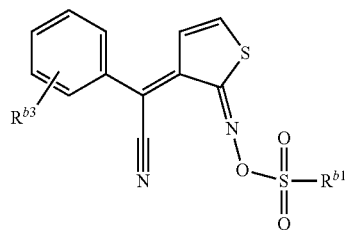

(b2)

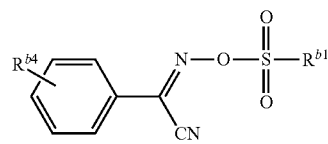

(b3)

where $R^{b1}$ represents a C1 to C18 hydrocarbon group which optionally has a fluorine atom and in which a methylene group optionally has been replaced by an oxygen atom or a carbonyl group, $R^{b3}$ and $R^{b4}$ each independently represent a hydrogen atom, a C1 to C5 alkyl group or a C1 to C5 alkoxy group, and the ring $W^{b1}$ represents a C6 to C14 aromatic hydrocarbon ring which can have a substituent.

In each of formulae (B1), (b1) to (b3), the hydrocarbon group represented by $R^{b1}$ includes C1 to C18 alkyl groups such as a methyl group, an ethyl group, a propyl group, an isopropyl group, a butyl group, a pentyl group, a hexyl group, heptyl group, an octyl group, decyl group or dodecyl group.

C3 to C18 alicyclic hydrocarbon groups such as a monocyclic alicyclic hydrocarbon group such as a C3 to C18 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group (e.g. a decahydronaphthyl group, an adamantyl group, a norbornyl group), C6 to C18 aromatic hydrocarbon groups such as a phenyl group, a naphthyl group, a p-methylphenyl group, a p-Cert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group and other groups such as aralkyl groups.

The hydrocarbon group is preferably a C1 to C10 alkyl group and a C6 to C10 aromatic hydrocarbon group, and more preferably a C1 to C8 alkyl group, and still more preferably a C1 to C4 alkyl group.

The hydrocarbon group in which a methylene group has been replaced by an oxygen atom or a carbonyl group includes those represented by formulae (Y1) to (Y12), preferably those represented by formulae (Y7) to (Y9), more preferably one represented by formula (Y9):

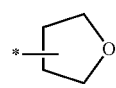

(Y1)

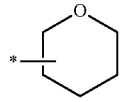

(Y2)

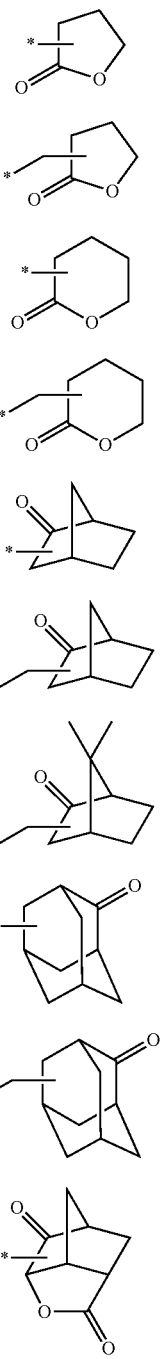

(Y3)
(Y4)
(Y5)
(Y6)
(Y7)
(Y8)
(Y9)
(Y10)
(Y11)
(Y12)

where "*" represents a binding position.

Examples of the hydrocarbon group which has a fluorine atom include fluoroalkyl groups such as a fluoromethyl group, a fluoroethyl group, a fluoropropyl group, a fluorobutyl group, a fluoropentyl group, a fluorohexyl group, a fluoroheptyl group and a fluorooctyl group; alicyclic fluorohydrocarbon groups such as C3 to C10 fluorocycloalkyl groups;

C6 to C10 aromatic fluorohydrocarbon groups such as a fluorophenyl group and fluoronaphtyl group, and a combined structure of them.

The hydrocarbon group which has a fluorine atom is preferably a C1 to C10 fluoroalkyl group and a C6 to C10 aromatic fluorohydrocarbon group, and more preferably a C1 to C8 perfluoroalkyl group, and still more preferably a C1 to C4 perfluoroalkyl group.

The alkyl group represented by $R^{b3}$ or $R^{b4}$ includes a methyl group, an ethyl group, a propyl group, a butyl group, and a pentyl group, preferably a methyl group.

The alkoxy group represented by $R^{b3}$ or $R^{b4}$ includes a methoxy group, ethoxy group, a propoxy group, a butoxy group, and a pentyloxy group, preferably a methoxy group.

The aromatic hydrocarbon ring represented by the ring $W^1$ includes a benzene ring, a naphthalene ring, and anthracene ring.

The aromatic heterocyclic group represented by the ring $W^{b1}$ may have a sulfur or oxygen atom, which includes the following ones:

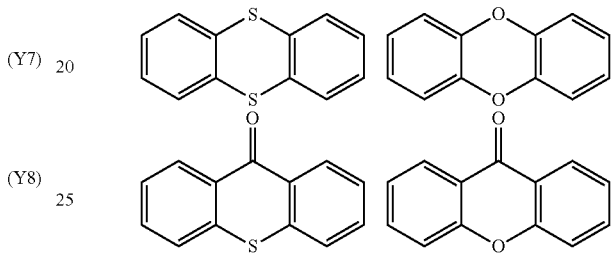

The substituent which the ring $W^{b1}$ optionally has includes a C1 to C5 alkyl group.

The ring $W^{b1}$ is preferably a substituted or unsubstituted naphthalene ring, more preferably an unsubstituted naphthalene ring.

Examples of the ionic acid generator include a compound represented by formula (b8) or (b9)

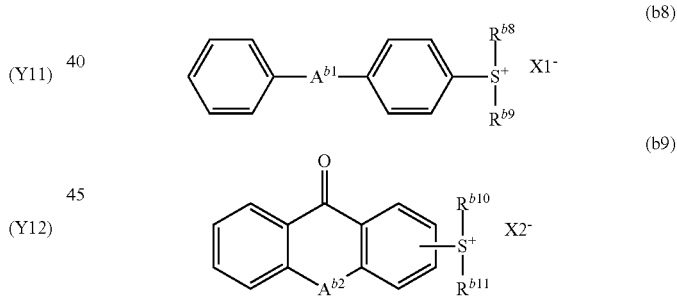

where $A^{b1}$ and $A^{b2}$ each independently represent an oxygen atom or a sulfur atom, $R^{b8}$, $R^{b9}$, $R^{b10}$ and $R^{b11}$ each independently represent a C1 to C10 alkyl group or a C6 to C12 aromatic hydrocarbon group, and X1$^-$ and X2$^-$ each independently represent an organic anion.

The alkyl groups represented by $R^{b8}$, $R^{b9}$, $R^{b10}$ and $R^{b11}$ include a methyl group, an ethyl group, a propyl group, a butyl group, a pentyl group, a hexyl group, a heptyl group and an octyl group.

The aromatic hydrocarbon groups represented by $R^{b8}$, $R^{b9}$, $R^{b10}$ and $R^{b11}$ include an aryl group such as phenyl group, a naphthyl group, an anthryl group, p-methylphenyl group, p-tert-buthylphenyl group, p-adamantylphenyl group, tolyl group, xylyl group, a cumenyl group, a mesityl group, a biphenyl group, a phenanthryl group, a 2,6-diethylphenyl group, and 2-methyl-6-ethylphenyl.

$R^{b8}$, $R^{b9}$, $R^{b10}$ and $R^{b11}$ are preferably a C6-C12 aromatic hydrocarbon croup, more preferably a phenyl group.

Examples of $X1^-$ and $X2^-$ include sulfonic acid anion, bis(alkylsulfonyl)amide anion and tris(alkylsulfonyl)methide anion. Preferable is a sulfonic acid anion, specifically a sulfonic acid anion represented by formula (b10).

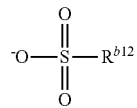
(b10)

where $R^{b12}$ represents a C1 to C18 hydrocarbon group where a hydrogen atom can be replaced by a fluorine atom and where a methylene group may be substituted with an oxygen atom or a carbonyl group.

Examples of $R^{b12}$ include those of $R^{b1}$.

Specific examples of the acid generator (B) include preferably the following compounds.

(b1-1)

(b1-2)

(b1-3)

(b1-4)

(b1-5)

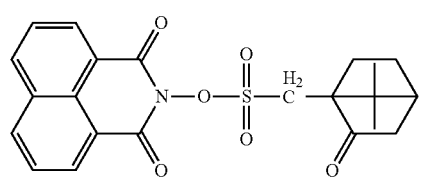

(b1-6)

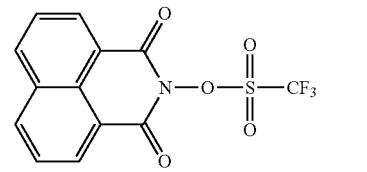

(b1-7)

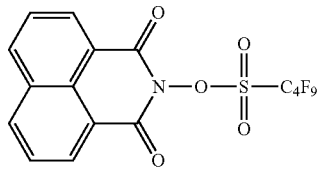

(b1-8)

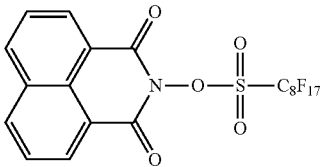

(b1-9)

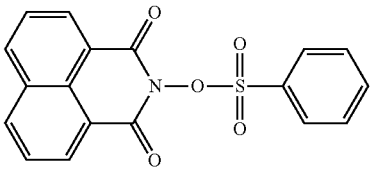

(b1-10)

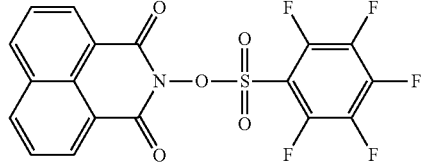

(b1-11)

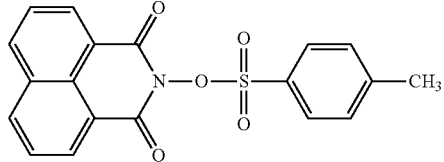

(b1-12)

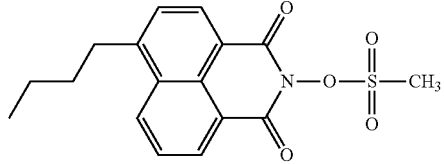

(b1-13)

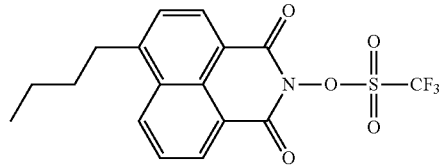

(b1-14)

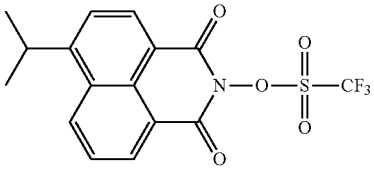

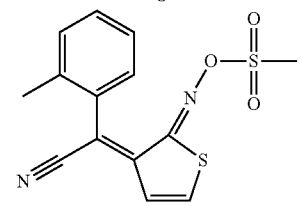

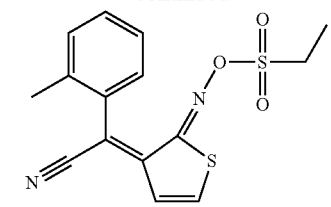
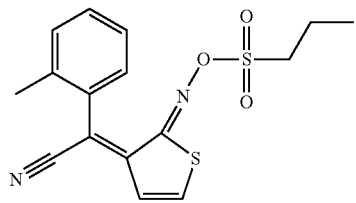
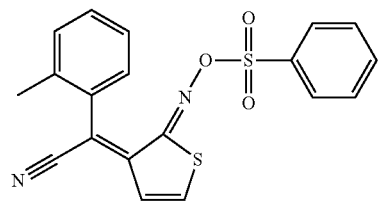
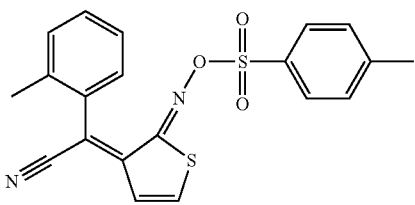
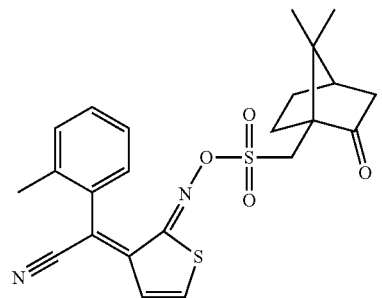
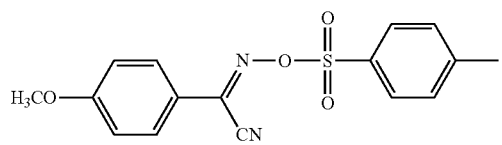
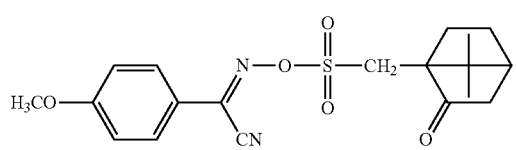
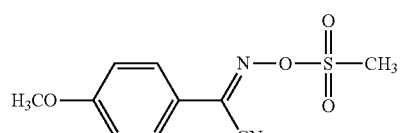
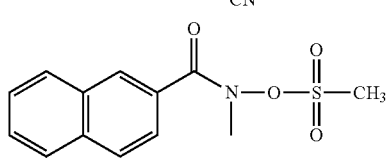
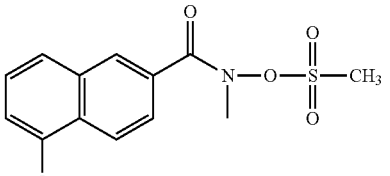
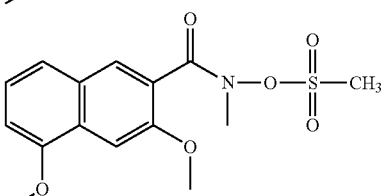
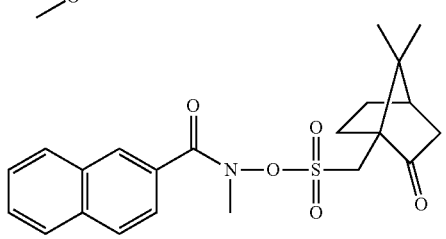
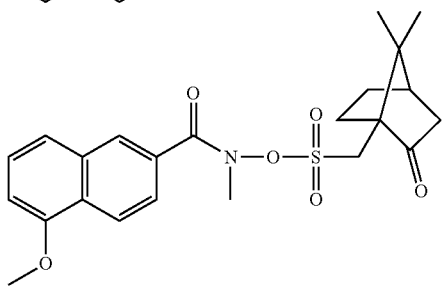
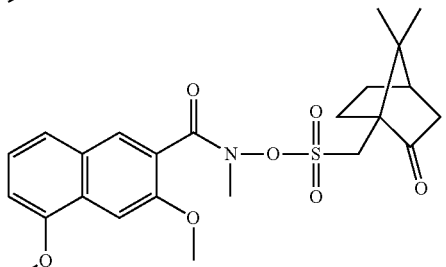
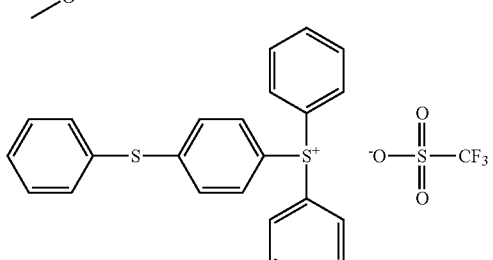
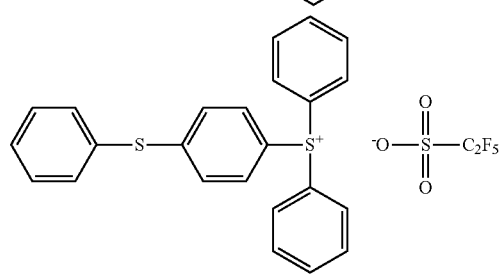

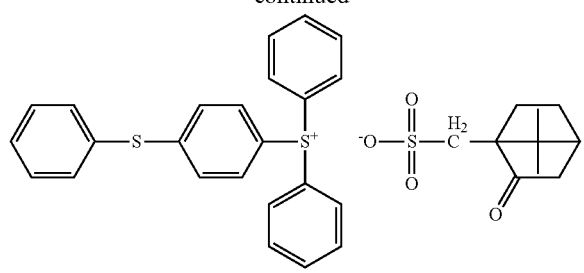
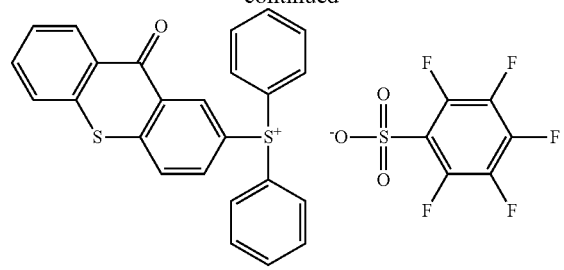
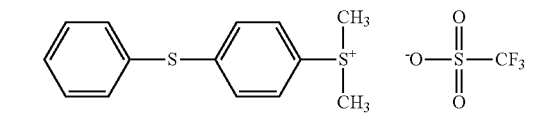
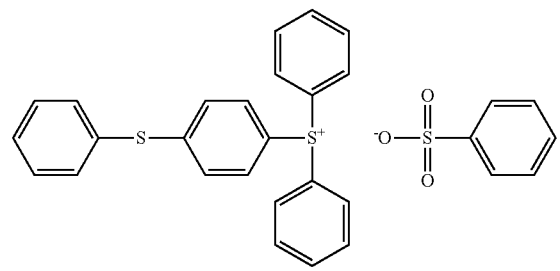
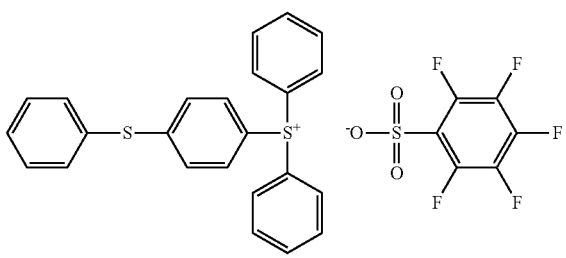
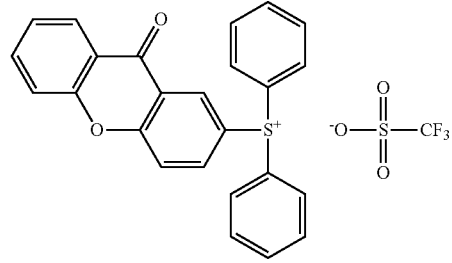
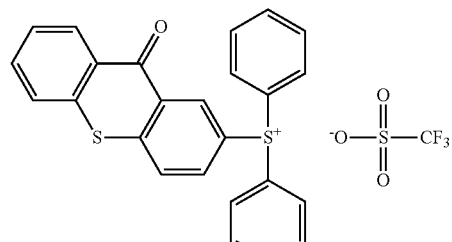
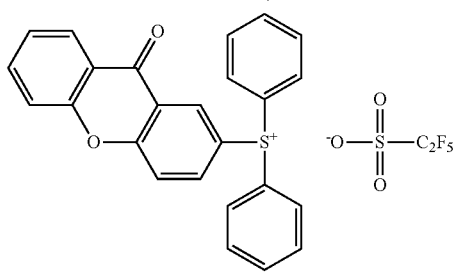

The acid generator (B) is available on the market, or it can be prepared by a known method.

The content of the acid generator (B) is preferably 0.3 parts by weight or more, more preferably 0.5 parts by weight or more, still more preferably 1 parts by weight or more, per 100 parts of the total resin, and preferably 30 parts by weight or less, more preferably 10 parts by weight or less, still more preferably 5 parts by weight or less, per 100 parts of the total resin.

<Solvent (D)>

The photoresist composition of the present invention comprises a solvent.

Examples of the solvent include glycoletherester such as ethyl cellosolve acetate, methylcellosolve acetate and propyleneglycolmonomethylether acetate; glycolether such as propyleneglycolmonomethyl ether; an acylic ester such as ethyl lactate, butyl acetate, amyl acetate and ethyl pyruvate; a ketone such as acetone, methylisobutylketone, 2-heptanone and cyclohexanone; and a cyclic ester such as γ-butyrolactone. The solvent is preferably a glycoletherester.

The content of the solvent (D) is usually 40% by weight or more, preferably 45% by weight or more, and more preferably 50% by weight or more, of the total amount of the photoresist composition of the present invention. The content of the solvent is usually 75% by weight or less, preferably 70% by weight or less, and more preferably 68% by weight or less, of the total amount of the photoresist composition of the present invention.

When the photoresist composition comprises a solvent within the above-mentioned range, it can easily form a composition film with thickness about 3 μm to 150 μm.

<Surfactant (F)>

The photoresist composition of the present invention may further contain a surfactant.

The surfactant for the photoresist composition is not limited to a specific one if it is capable of improving coating properties, defoaming properties and leveling of the photoresist composition. Examples of the surfactant include a surfactant having a fluorine atom, a surfactant having a silicon atom and a fluorine atom, a polyether-denaturated silicone compound and other silicone compounds.

Examples of the polyether-denaturated silicone compounds include BY16-201 (brand name), SF8427 (brand name), SF8428 (brand name), FZ-2162 (brand name), SH3749 (brand name), FZ-77 (brand name), FZ-2110 (brand name), SH8400 (brand name) (product of Toray Dow Corning Co., Ltd.).

Examples of the surfactant having a fluorine atom include Fluorinert FC430 (brand name) and Fluorinert FC431 (brand name), which are products made by Sumitomo 3M, Co., Ltd., MEGAFACE F142D (brand name), MEGAFACE F171 (brand name), MEGAFACE F172 (brand name), MEGAFACE F173 (brand name), MEGAFACE F177 (brand name) and MEGAFACE F183 (brand name), MEGAFACE R30 (brand name), which are products made by Dainippon Ink & Chemicals, Inc., EFTOP EF301 (brand name), EFTOP EF303 (brand name), EFTOP EF351 (brand name) and EFTOP EF352 (brand name), which are products made by Mitsubishi materials Electronic chemicals, Co., Ltd., SURFLON S381 (brand name), SURFLON S382 (brand name), SURFLON SC101 (brand name) and SURFLON SC105 (brand name), which are products made by AGC SEMI CHEMICAL, Co., Ltd., E5844 (brand name), a product made by Daikin fine chemical research institute Co., Ltd., and BM-1000 (brand name) and BM-1100 (brand name) which are products made by BM Chemie company.

Examples of the surfactant having a silicon atom and a fluorine atom include MEGAFACE R08 (brand name), MEGAFACE BL20 (brand name), MEGAFACE F475 (brand name), MEGAFACE F477 (brand name) and MEGAFACE F443 (brand name), which are products made by Dainippon Ink & Chemicals, Inc.

Examples of the other silicone compounds include DOW CORNING TORAY DC3PA (brand name), DOW CORNING TORAY SH7PA (brand name), DOW CORNING TORAY DC11 PA (brand name), DOW CORNING TORAY SH21 PA (brand name), DOW CORNING TORAY SH28PA (brand name), DOW CORNING TORAY 29SHPA (brand name), DOW CORNING TORAY SH30PA (brand name), polyether denaturation silicone oil (e.g. DOW CORNING TORAY SH8400 (brand name)), which are products made by DOW CORNING TORAY Co., Ltd., KP321 (brand name), KP322 (brand name), KP323 (brand name), KP324 (brand name), KP326 (brand name), KP340 (brand name), RP341 (brand name), which are products made by Shin-etsu silicone, Co, Inc., TSF400 (brand name), TSF401 (brand name), TSF410 (brand name), TSF4300 (brand name), TSF4440 (brand name), TSF4445 (brand name), TSF-4446 (brand name), TSF4452 (brand name), TSF4460 (brand name), which are products made by Momentive performance Japan, Co., Ltd.

If the photoresist composition further contains the surfactant (F), the content of that is usually 0.0001% by weight or more, preferably 0.0005% by weight or more, more preferably 0.001% by weight or more, still more preferably 0.002% by weight or more, of the total amount of the photoresist composition of the present invention. The content of that is usually 0.5% by weight or less, preferably 0.3% by weight or less, more preferably 0.2% by weight or less, and still more preferably 0.1% by weight or less, of the total amount of the photoresist composition of the present invention.

<Quencher (C)>

The photoresist composition of the present invention may further contain a quencher. The quencher has a property that it can trap an acid, especially an acid generated from the acid generator by applying a radiation. Examples of the quencher, which is not limited to any specific one, include a basic nitrogen-containing organic compound.

Examples of the basic nitrogen-containing organic compound include an amine compound such as an aliphatic amine, an aromatic amine and an ammonium salt. Examples of the aliphatic amine include a primary amine, a secondary amine and a tertiary amine.

Examples of the amine compound include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris [2-(2-methoxyethoxy)ethyl] amine, triisopropanolamine, ethylenediamine, tetramethylenediamine, hexamethylenediamine, 4,4'-diphenylethane, 4,4-diamino-3,3'-dimethyldiphenylmethane and 4,4-diamino-3,3'-diethyldiphenylmethane The quencher is preferably a cyclic amine compound. The cyclic amine compound may be an aromatic one or a non-aromatic one. Examples of the cyclic amine compound include a compound which has a pyridine, pyrazole, imidazole, piperidine, oxazole or pyrrolidine, and a compound which has any one of these cyclic amines and an aromatic hydrocarbon group such as a phenyl group or naphtyl group.

Specific examples of the quencher further include those represented by formulae (C2-1) to (C2-11), preferably those represented by formulae (C2-2) to (C2-8).

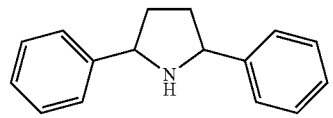

(C2-1)

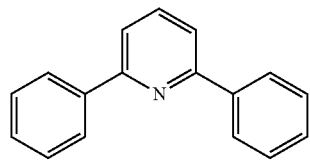

(C2-2)

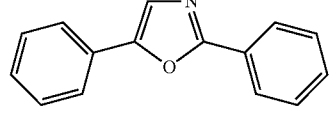

(C2-3)

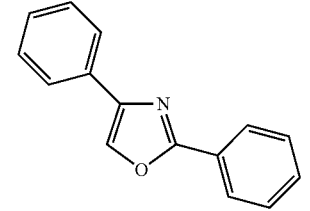

(C2-4)

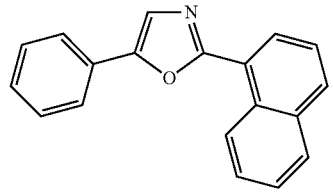

(C2-5)

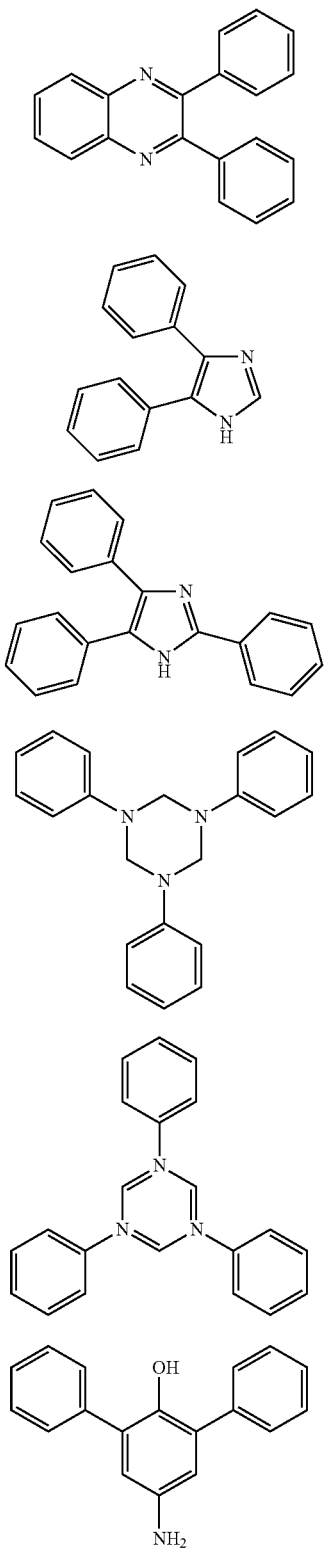

(C2-6)

(C2-7)

(C2-8)

(C2-9)

(C2-10)

(C2-11)

The quencher can be prepared by a known method, which is available on the market.

The content of the quencher is preferably 0.0001 to 5% by weight, more preferably 0.0001 to 4% by weight, still more preferably 0.001 to 3% by weight, further more preferably 0.01 to 1% by weight, still further more preferably 0.1 to 0.7% by weight, based on sum the solid components of the photoresist composition.

<Adhesion Promoter (E)>

Adhesion promoter (E) is not limited to specific one if it is capable of improving adhesiveness to metals to be used for substrates or wirings, or preventing corrosion of the metals. The component can show a function as rust prevention by preventing corrosion of the metals. Together with these functions, the component can provide the composition with improved adhesiveness to substrates or metals.

Examples of the adhesion promoter (E) include sulfur-containing compounds, aromatic hydroxy compounds, bent triazole-based compounds, triazine-based compounds and silicon-containing compounds.

Examples of the sulfur-containing compounds include dithioglycerol [S(CH$_2$CH(OH)CH$_2$(OH))$_2$], bis(2,3-dihydroxypropylthio)ethylene [CH$_2$CH$_2$(SCH$_2$CH(OH)CH$_2$(OH))$_2$], sodium 3-(2,3-dihydroxypropylthio)-2-methyl-propylsulfonate [CH$_2$(OH)OH(OH)CH$_2$SCH$_2$CH(CH$_3$)CH$_2$SO$_3$NA], 1-thioglycerol [HSCH$_2$CH(OH)CH$_2$(OH)], sodium 3-mercapto-1-propanesulfonate [HSCH$_2$CH$_2$CH$_2$SO$_3$Na], 2-mercaptoethanol [HSCH$_2$CH$_2$(OH)], thioglycolic acid [HSCH$_2$CO$_2$H], 3-mercapto-1-propanol [HSCH$_2$CH$_2$CH$_2$], sulfur-containing compounds recited in JP2015-087759A1.

Examples of the aromatic hydroxy compounds include phenol, cresol, xylenol, pyrocatechol (=1,2-dihydroxybenzene), tort-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, aminophenol, aminoresorcinol, p-hydroxybenzoate, o-hydroxybenzoic acid, 2,4-dihydroxybenzoic acid, 2,5-dihydroxybenzoic acid, 3,4-dihydroxybenzoic acid, 3,5-dihydroxybenzoic acid, and gallic acid.

Examples of the benzotriazole-based compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, 1-(2,3-dihydroxypropyl) benzotriazole or 2,2'-{[(4-methyl-1H-benzotriazole-1-yl) methyl]imino} bisethanol which is commercially available from BASF AG as the "IRGAMET"® series, 2,2'-{[(5-methyl-1H-benzotriazole-1-yl)methyl]imino} bisethanol, 2,2'-{[(4-methyl-1H-benzotriazole-1-yl)methyl]imino} bisethane and 2,2'-{[(4-methyl-1H-benzotriazole-1-yl)methyl]imino}bispropane Examples of the triazine-based compounds include 1,3,5-triazine-2,4,6-trithol.

Examples of the silicon-containing compounds include the following compounds.

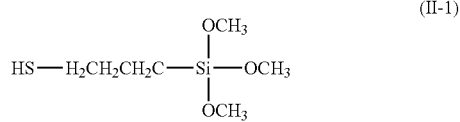

(II-1)

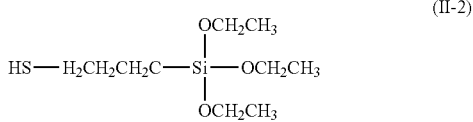

(II-2)

-continued

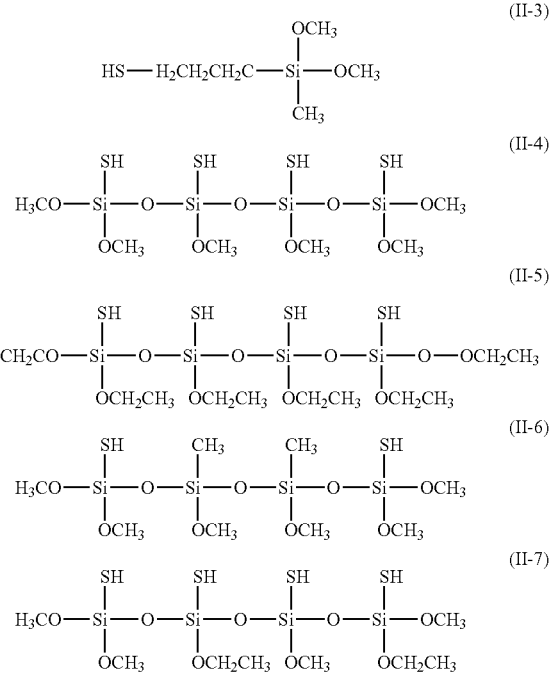

The content of the adhesion promoter (E) is preferably 0.001% by weight or more, more preferably 0.0002% by weight or more, still more preferably 0.05% by weight or more, further more preferably 0.08% by weight or more, based on sum the solid components of the photoresist composition.

The content of the adhesion promoter (E) is preferably 20% by weight or less, more preferably 10% by weight or less, still more preferably 4% by weight or less, further more preferably 3% by weight or less, particularly more preferably 1% by weight or less, especially more preferably 0.1% by weight or less based on sum the solid components of the photoresist composition.

The photoresist composition which further contains the adhesion promoter (FE) in the amount of the above-mentioned range can provide a precise photoresist pattern with good adhesiveness to substrates.

<Other Components (G)>

The photoresist composition of the present invention may further contain if necessary, a small amount of various additives such as a sensitizer, a plasticizer, a dissolution inhibitor, a stabilizer and a dye as long as the effect of the present invention is not prevented.

<Production of Photoresist Composition>

The photoresist composition of the present invention can usually be prepared by mixing, Resin (A1), Resin (A2), an acid generator (B) and solvent (D), and if necessary Resin (A3), Surfactant (F), Quencher (C), adhesion promoter (E), and other components (G) at a suitable ratio for the composition, optionally followed by filtrating the mixture with a filter having from 0.11 μm to 50 μm of a pore size.

The order of mixing these components is not limited to any specific order. The temperature at mixing the components is usually 10 to 40° C., which can be selected depending on the resin or the like. The mixing time is usually 0.5 to 24 hours, which can be selected in view of the species of the resin or solubility of that in solvents. The means for mixing the components is not limited to specific ones, which includes a stirrer.

The amounts of the components in the photoresist composition can be adjusted by selecting the amount to be used for production of them.

<Production of Photoresist Pattern>

The method of the present invention has the following steps (1) to (4):

(1) a step of applying the photoresist composition of the present invention on a substrate,
(2) a step of forming a photoresist composition film by drying the composition,
(3) a step of exposing the film to radiation, and
(4) a step of developing the exposed film to form a photoresist pattern.

In the step (1), applying of the composition on a substrate is usually conducted using a conventional apparatus such as spin coater.

The substrate includes silicon wafers. The substrate on which semiconductor elements (e.g., a transistor, a diode) may have been formed in advance can be used for the process. If the photoresist composition is to be used for bump formation, a substrate on which a conductive material has been laminated is preferred. Such conductive material includes an alloy which comprises a metal selected from the group consisting of gold (Au) copper (Cu), nickel (Ni), tin (Sn), palladium (Pd) and silver (Ag), or alloys comprising a metal selected from the group. Preferred is copper or an alloy comprising copper.

The substrate may be washed or coated with a reflect-preventing layer such as one containing hexamethyldisilazane. For forming the reflect-preventing layer, such composition for organic reflect-preventing layer as available on the market can be used.

The photoresist composition film is usually formed by drying the applied composition with a heating apparatus such as hot plate or a decompressor, to thereby dry off the solvent. The heating temperature is preferably 50 to 200° C., and the operation pressure is preferably 1 to $1.0*10^5$ Pa.

The thickness of the film obtained by step (2) is in the range of preferably 3 μm to 150 μm, more preferably 4 μm to 100 μm.

The film is exposed to radiation using an exposure system. The exposure is usually conducted through a mask having a pattern corresponding to a desired photoresist pattern. The exposure source includes known one, preferably g ray (wavelength: 436 nm), h ray (wavelength: 405 nm) and i ray (wavelength: 365 nm).

The process may further comprise baking the exposed film, so called post-exposure bake, after step (3).

The step of baking the exposed film can be conducted with heating means such as hot plates. The temperature of baking the exposed film is preferably 50° C. to 200° C., and more preferably 60° C. to 120° C. The time of baking is usually 40 to 400 seconds, preferably 50 to 350 seconds.

The development of the exposed or baked photoresist composition film is usually carried out with an alkaline developer using a development apparatus.

The alkaline developer to be used may be any one of various aqueous alkaline solution to be used in the art. Generally, an aqueous solution of tetramethylammonium hydroxide or (2-hydroxyethyl) trimethylammonium hydroxide (commonly known as "choline") is often used.

After development, the formed photoresist pattern is preferably washed with ultrapure water, and the remained water on the photoresist pattern and the substrate is preferably removed.

<USE>

The photoresist composition of the present invention can provide thick photoresist films and fine photoresist pattern on such thick film with from about 3 μm to about 150 μm.

The photoresist composition of the present invention is useful as a material for producing bumps.

Bumps can be produced by the process having the following steps;

laminating a conductive material (i.e. seed metal) on a wafer which has semiconductor elements thereon to thereby form a conductive film, making a photoresist pattern on the conductive film from the composition of the present invention, pattern plating an electrode material such as Cu, Ni or solder, using the photoresist pattern as its mold, and removing the photoresist film and the conductive film from the device by etching or the like, optionally followed by removing the electrode material by heat-melting the electrode material.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

The weight-average molecular weight of any material used in the following examples is a value determined by gel permeation chromatography under the following conditions.

Equipment: HLC-8120GPC type, manufactured by TOSOH CORPORATION

Column: TSKgel Multipore $H_{XL}$-$M_X$ 3 with guard column, manufactured by TOSOH CORPORATION Solvent: tetrahydrofuran Flow rate: 1.0 mL/min.

Detector: RI Detector

Column temperature: 40° C.

Injection volume: 100 μL

Standard reference material: standard polystyrene, manufactured by TOSOH CORPORATION Synthesis Example 1

In a reactor, 86 parts of methacrylic acid, 516 parts of tert-methylbutylether and 99.2 parts of chloromethylether were mixed and stirred. To the obtained mixture, 111.2 parts of triethylamine were dropped over a period of one hour on an ice bath, and then stirred at room temperature for six hours.

To the reaction mixture, 172 parts of tert-methylbutylether and 260 parts of ion exchanged water were added, and then an organic layer was separated therefrom.

To the organic layer, 260 parts of 1% oxalic acid was added and an organic layer was newly separated therefrom.

To the newly separated organic layer, 260 parts of on exchanged water was added, and then washed organic layer was separated therefrom: the washing step was conducted three times. Then the obtained organic layer was concentrated and then dried under reduced pressure to give 131.3 parts of the compound represented by formula (A).

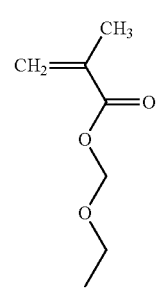

(A)

Synthesis Example 2

In a reactor, 60 parts of methacrylic acid, 480 parts of tert-methylbutylether and 103.6 parts of chloromethylcyclohexylether were mixed and stirred. To the obtained mixture, 74 parts of triethylamine were dropped over a period of one hour on an ice bath, and then stirred at room temperature for six hours.

To the reaction mixture, 120 parts of tert-methylbutylether and 240 parts of ion-exchanged water were added, and then an organic layer was separated therefrom.

To the organic layer, 240 parts of 1% oxalic acid was added, and an organic layer was newly separated therefrom.

To the newly separated organic layer, 240 parts of ion exchanged water was added, and then washed organic layer was separated therefrom: the washing step was conducted three times. Then the obtained organic layer was concentrated and then dried under reduced pressure to give 135.4 parts of the compound represented by formula (B).

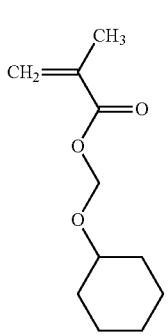

(B)

Synthesis Example 3

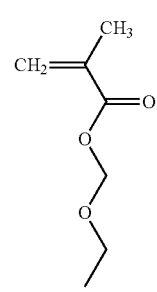

(A)

-continued

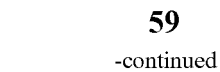
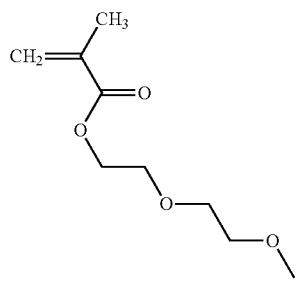 (C)

By mixing 13.1 parts of the compound represented by formula (A), 15.7 parts of compound represented by formula (C), 0.137 parts of azobisisobutyronitrile and 12.8 parts of propyleneglycolmonomethylether acetate, Mixture (1) was obtained.

Into a flask equipped with a thermometer and a stirrer, 27.7 parts of propyleneglycolmonomethylether acetate was fed and then increased its temperature to 80° C. Thereinto, Mixture (1) was dropped while being stirred over a period of one hour, and then heated at 80° C. for nine hours. Then the reaction mixture was cooled to 40° C. and then diluted with 30.4 parts of propyleneglycolmethylether acetate, and then 168 parts of methanol and 336 parts of ion-exchanged water, followed by collecting precipitated resin by filtration.

To the precipitated resin, 129 parts of propyleneglycolmethylether acetate was added and stirred, followed by concentrating it to obtain 45.3 parts of resin solution (Solid content: 48% by weight).

The obtained resin is referred to as "Resin A1-1", the weight average molecular weight of which was $6.8 \times 10^4$. Resin. A1-1 had the following structural units.

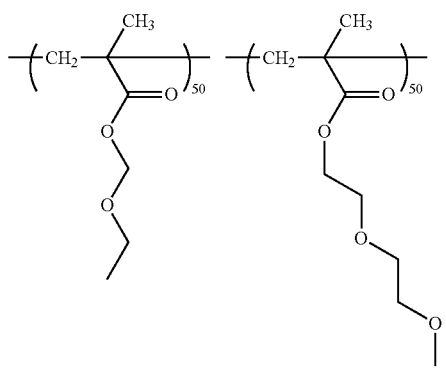

Synthesis Example 4

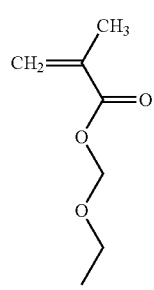 (A)

-continued

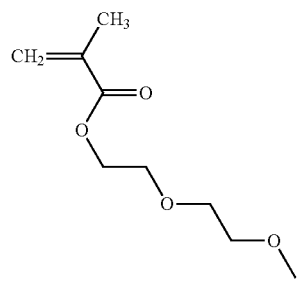 (C)

By mixing 10.9 parts of the compound represented by formula (A), 19.6 parts of compound represented by formula (C), 0.142 parts of azobisisobutyronitrile and 13.9 parts of propyleneglycolmonomethylether acetate, Mixture (2) was obtained.

Into a flask equipped with a thermometer and a stirrer, 29.6 parts of propyleneglycolmonomethylether acetate was fed and then increased its temperature to 80° C. Thereinto, Mixture (2) was dropped while being stirred over a period of one hour, and then heated at 80° C. for nine hours.

Then the reaction mixture was cooled to 40° C. and then diluted with 32.5 parts of propyleneglycolmethylether acetate, and then 179 parts of methanol and 359 parts of ion-exchanged water, followed by collecting precipitated resin by filtration.

To the precipitated resin, 138 parts of propyleneglycolmethylether acetate was added and stirred, followed by concentrating it to obtain 42.3 parts of resin solution (Solid content: 56.3% by weight).

The obtained resin is referred to as "Resin A1-2", the weight average molecular weight of which was $7.4 \times 10^4$. Resin A1-2 had the following structural units.

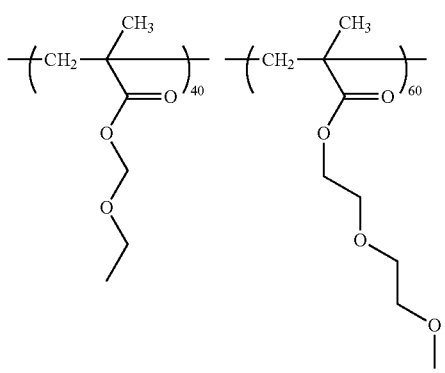

Synthesis Example 5

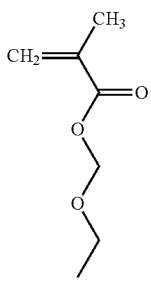
(A)

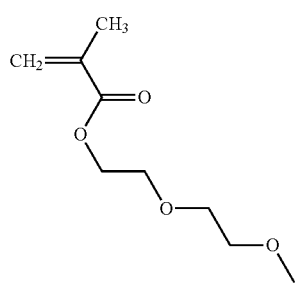
(C)

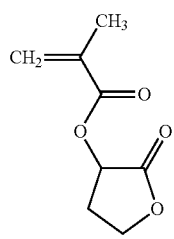
(D)

By mixing 25.1 parts of the compound represented by formula (A), 19.6 parts of compound represented by formula (C), 11.8 parts of compound represented by formula (D), 0.285 parts of azobisisobutyronitrile and 28.1 parts of propyleneglycolmonomethylether acetate, Mixture (3) was obtained.

Into a Flask equipped with a thermometer and a stirrer, 56.4 parts of propyleneglycolmonomethylether acetate was fed and then increased its temperature to 80° C. Thereinto, Mixture (3) was dropped while being stirred over a period of one hour, and then heated at 80° C. for nine hours.

Then the reaction mixture was cooled to 40° and then diluted with 62 parts of propyleneglycolmethylether acetate, and then 342 parts of methanol and 684 parts of ion-exchanged water, followed by collecting precipitated resin by filtration.

To the precipitated resin, 263 parts of propyleneglycol-methylether acetate was added and stirred, followed by concentrating it to obtain 99 parts of resin solution (Solid content: 51.3% by weight).

The obtained resin is referred to as "Resin A1-3", the weight average molecular weight of which was $6\times10^4$. Resin A1-3 had the following structural units.

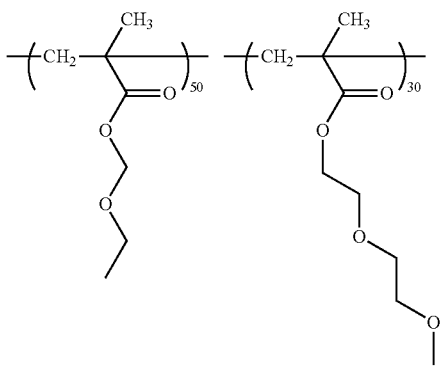

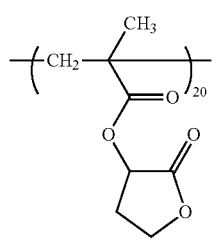

Synthesis Example 6

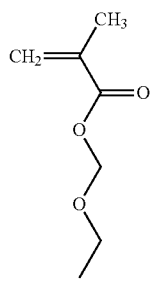
(A)

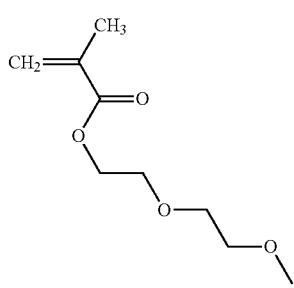
(C)

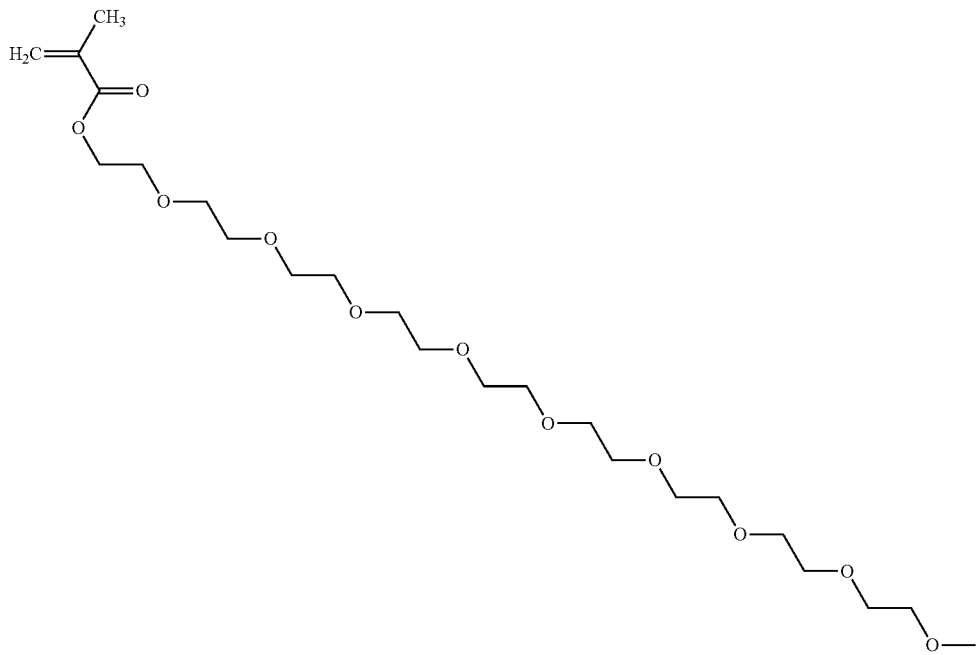
(E)

By mixing 10.9 parts of the compound represented by formula (A), 10.4 parts of compound represented by formula (C), 6.9 parts of compound represented by formula (E), 0.285 parts of azobisisobutyronitrile and 12.8 parts of propyleneglycolmonomethylether acetate, Mixture (4) was obtained.

Into a flask equipped with a thermometer and a stirrer, 27.4 parts of propyleneglycolmonomethylether acetate was fed and then increased its temperature to 80° C. Thereinto, Mixture (4) was dropped while being stirred over a period of one hour, and then heated at 80° C. for nine hours.

Then the reaction mixture was cooled to 40° C. and then diluted with 30.1 parts of propyleneglycolmethylether acetate, and then 178 parts of methanol and 178 parts of ion-exchanged water, followed by collecting precipitated resin by filtration.

To the precipitated resin, 155 parts of propyleneglycolmethylether acetate was added and stirred, followed by concentrating it to obtain 53.1 parts of resin solution (Solid content: 34.1% by weight).

The obtained resin is referred to as "Resin A1-4", the weight average molecular weight of which was $16 \times 10^4$. Resin A1-4 had the following structural units.

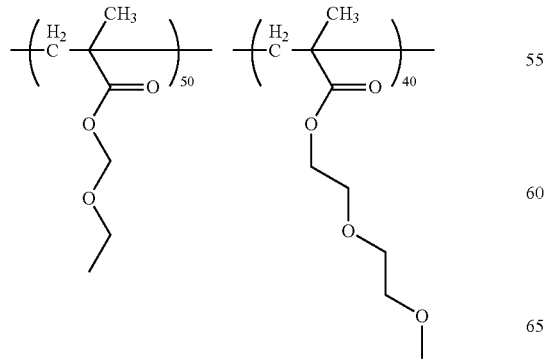

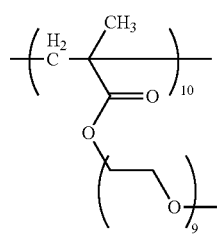

Synthesis Example 7

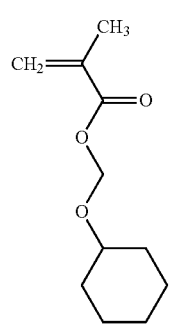

(B)

-continued

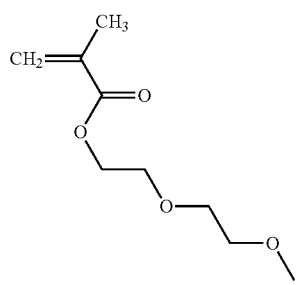
(C)

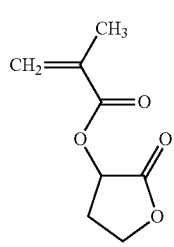
(D)

By mixing 32.1 parts of the compound represented by formula (B), 24.3 parts of compound represented by formula (C) 5.5 parts of compound represented by formula (D), 0.186 parts of azobisisobutyronitrile and 30.8 parts of propyleneglycolmonomethylether acetate, Mixture (5) was obtained.

Into a flask equipped with a thermometer and a stirrer, 61.8 parts of propyleneglycolmonomethylether acetate was fed and then increased its temperature to 80° C. Thereinto, Mixture (5) was dropped while being stirred over a period of one hour, and then heated at 80° C. for nine hours.

Then the reaction mixture was cooled to 40° C. and then diluted with 68 parts of propyleneglycolmethylether acetate, and then 281 parts of methanol and 844 parts of ion-exchanged water, followed by collecting precipitated resin by filtration. To the precipitated resin, 288 parts of propyleneglycolmethylether acetate was added and stirred, followed by concentrating it to obtain 113.7 parts of resin solution (Solid content: 44.8% by weight).

The obtained resin is referred to as "Resin A1-5", the weight average molecular weight of which was $13.3 \times 10^4$. Resin A1-5 had the following structural units.

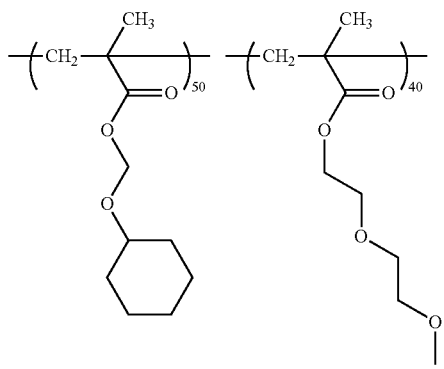

-continued

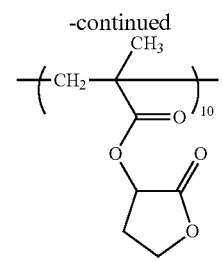

Synthesis Example 8

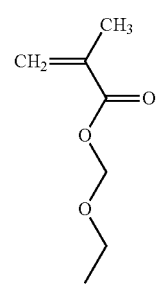
(A)

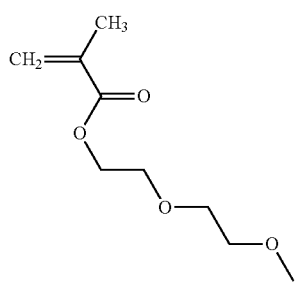
(C)

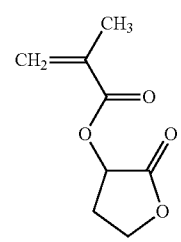
(D)

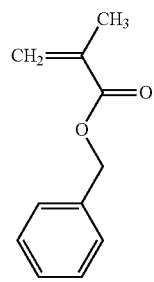
(F)

By mixing 26.1 parts of the compound represented by formula (A), 9.9 parts of compound represented by formula (C), 4.5 parts of compound represented by formula (D), 9.3 parts of compound represented by formula (F), 0.129 parts of azobisisobutyronitrile and 24.6 parts of propyleneglycolmonomethylether acetate, Mixture (6) was obtained.

Into a flask equipped with a thermometer and a stirrer, 49.6 parts of propyleneglycolmonomethylether acetate was fed and then increased its temperature to 80° C. Thereinto, Mixture (6) was dropped while being stirred over a period of one hour, and then heated at 80° C. for nine hours.

Then the reaction mixture was cooled to 40° C. and then diluted with 54.5 parts of propyleneglycolmethylether acetate, and then 271 parts of methanol and 632 parts of ion-exchanged water, followed by collecting precipitated resin by filtration.

To the precipitated resin, 264 parts of propyleneglycolmethylether acetate was added and stirred, followed by concentrating it to obtain 97.7 parts of resin solution (Solid content: 39% by weight).

The obtained resin is referred to as "Resin A1-6", the weight average molecular weight of which was $9.1 \times 10^4$. Resin A1-6 had the following structural units.

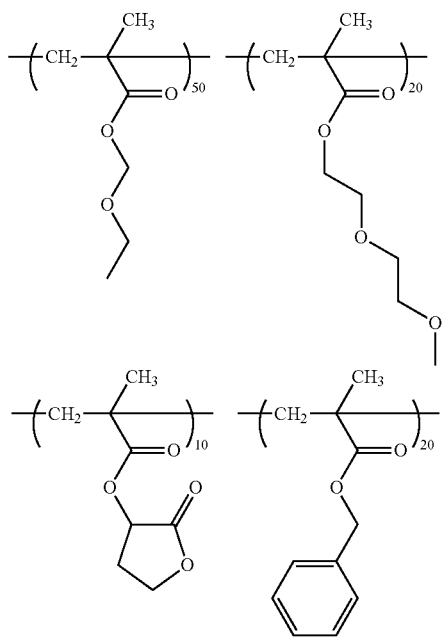

Synthesis Example 9

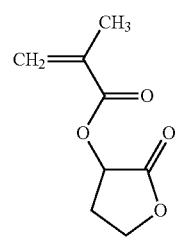

By mixing 30.4 parts of the compound represented by formula (A), 11.4 parts of compound represented by formula (C), 15.5 parts of compound represented by formula (D), 0.164 parts of azobisisobutyronitrile and 28 parts of propyleneglycolmonomethylether acetate, Mixture (7) was obtained.

Into flask equipped with a thermometer and a stirrer, 56.9 parts of propyleneglycolmonomethylether acetate was fed and then increased its temperature to 80° C. Thereinto, Mixture (7) was dropped while being stirred over a period of one hour, and then heated at 80° C. for nine hours.

Then the reaction mixture was cooled to 40° C. and then diluted with 62.5 parts of propyleneglycolmethylether acetate, and then 310 parts of methanol and 724 parts of ion-exchanged water, followed by collecting precipitated resin by filtration.

To the precipitated resin, 303 parts of propyleneglycolmethylether acetate was added and stirred, followed by concentrating it to obtain 144.2 parts of resin solution (Solid content: 34.8% by weight).

The obtained resin is referred to as "Resin A1-7", the weight average molecular weight of which was $8.4 \times 10^4$. Resin. A1-7 had the following structural units.

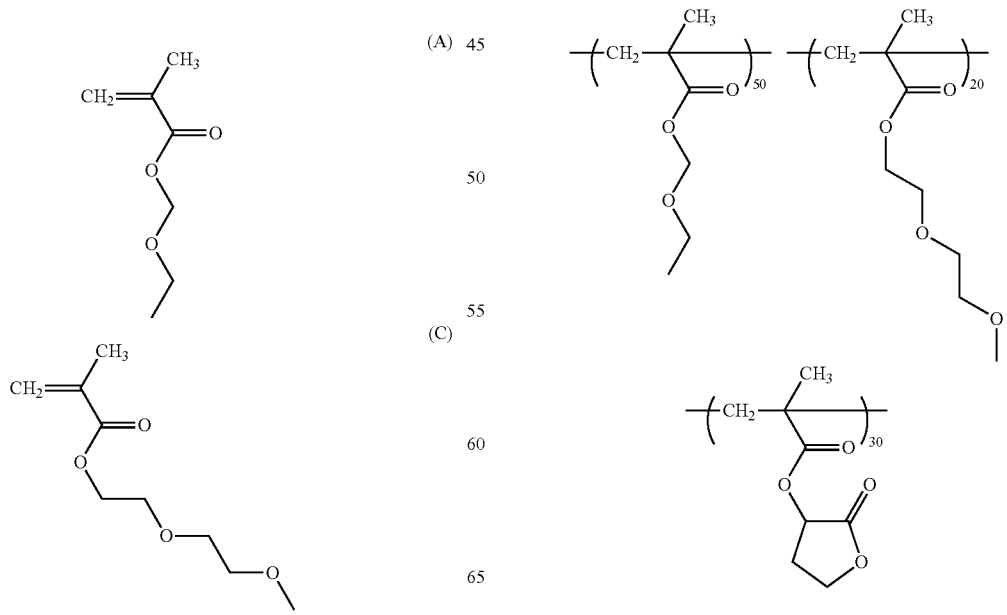

Synthesis Example 10

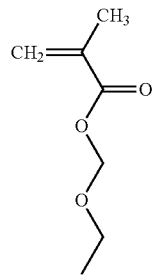 (A)

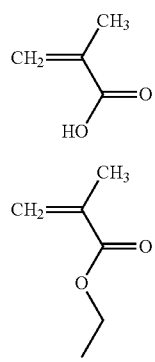 (G)

(H)

By mixing 21.3 parts of the compound represented by formula (A), 4.6 parts of compound represented by formula. (G), 42.3 parts of compound represented by formula (H), 0.261 parts of azobisisobutyronitrile and 29.1 parts of propyleneglycolmonomethylether acetate, Mixture (8) was obtained.

Into a flask equipped with a thermometer and a stirrer, 58.5 parts of propyleneglycolmonomethylether acetate was fed and then increased its temperature to 80° C. Thereinto, Mixture (8) was dropped while being stirred over one and half hours, and then heated at 80° C. for nine hours.

Then the reaction mixture was cord to 40° C. and then diluted with 88.3 parts of propyleneglycolmethylether acetate, and then 371 parts of methanol and 865 parts of ion-exchanged water, followed by collecting precipitated resin by filtration.

To the precipitated resin, 362 parts of propyleneglycolmethylether acetate was added and stirred, followed by concentrating it to obtain 120.7 parts of resin solution (Solid content: 42.2% by weight).

The obtained resin is referred to as "Resin A1-8", the weight average molecular weight of which was $7.6 \times 10^4$. Resin A1-8 had the following structural units.

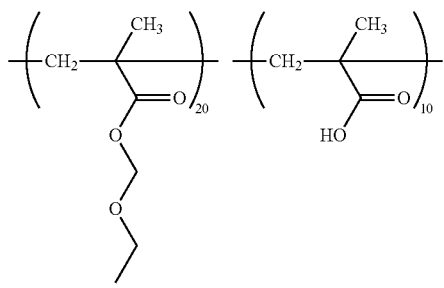

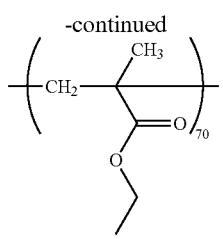

Synthesis Example 11

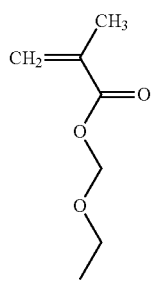 (A)

(G)

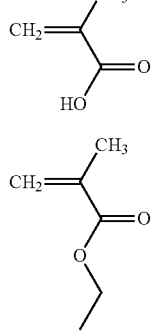 (H)

By mixing 27.5 parts of the compound represented by formula (A), 4.1 parts of compound represented by formula (G), 32.3 parts of compound represented by formula H), 0.232 parts of azobisisobutyronitrile and 27.5 parts of propyleneglycolmonomethylether acetate, Mixture (9) was obtained.

Into a flask equipped with a thermometer and a stirrer, 55.8 parts of propyleneglycolmonomethylether acetate was fed and then increased its temperature to 80° C. Thereinto, Mixture (9) was dropped while being stirred over one and half hours, and then heated at 80° C. for nine hours.

Then the reaction mixture was cooled to 40° C. and then diluted with 83.6 parts of propyleneglycolmethylether acetate, and then 351 parts of methanol and 819 parts of ion-exchanged water, followed by collecting precipitated resin by filtration.

To the precipitated resin, 343 parts of propyleneglycolmethylether acetate was added and stirred, followed by concentrating it to obtain 114.3 parts of resin solution (Solid content: 44.6% by weight).

The obtained resin is referred to as "Resin A1-9", the weight average molecular weight of which was $8.3 \times 10^4$. Resin A1-9 had the following structural units.

71
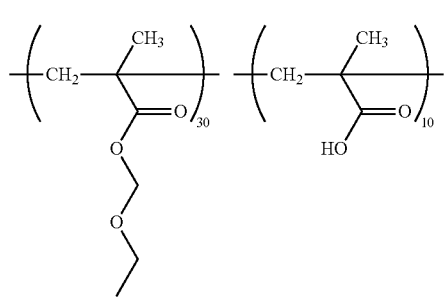
72
-continued
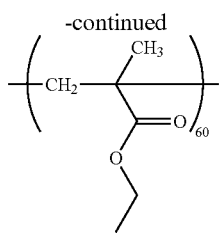
Synthesis Example 12
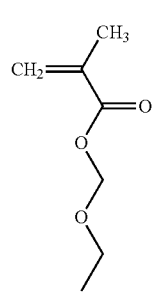  (A)
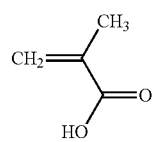  (G)
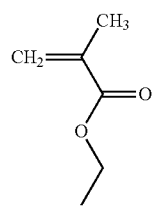  (H)
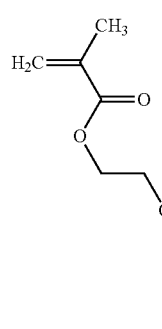  (E)
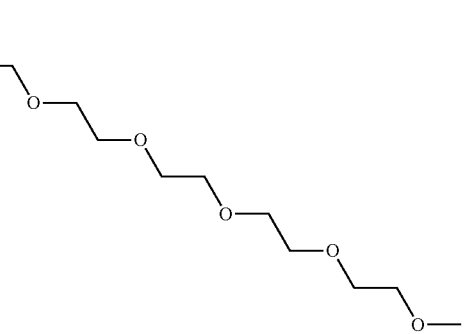

By mixing 16.2 parts of the compound represented by formula (A), 3.5 parts of compound represented by formula (G), 27.64 parts of compound represented by formula (H), 20 parts of compound represented by formula (E), 0.199 parts of azobisisobutyronitrile and 28.9 parts of propyleneglycolmonomethylether acetate, Mixture (10) was obtained.

Into a flask equipped with a thermometer and a stirrer, 58.2 parts of propyleneglycolmonomethylether acetate was fed and then increased its temperature to 80° C. Thereinto, Mixture (10) was dropped while being stirred over one and half hours, and then heated at 80° C. for nine hours.

Then the reaction mixture was cooled to 40° C. and then diluted with 87.3 parts of propyleneglycolmethylether acetate, and then 367 parts of methanol and 856 parts of ion-exchanged water, followed by collecting precipitated resin by filtration.

To the precipitated resin, 358 parts of propyleneglycolmethylether acetate was added and stirred, followed by concentrating it to obtain 119.4 parts of resin solution (Solid content: 44.8% by weight).

The obtained resin is referred to as "Resin A1-10", the weight average molecular weight of which was $10.8 \times 10^4$. Resin A1-10 had the following structural units.

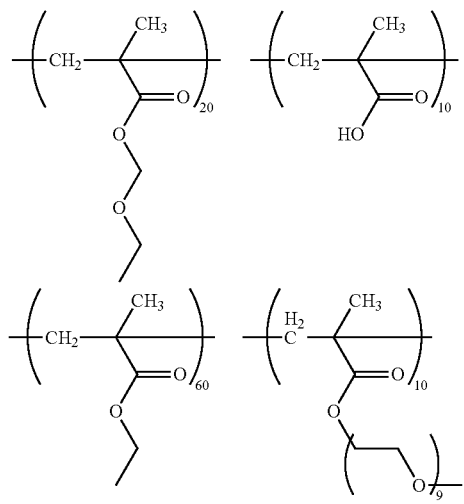

Synthesis Example 13

To a four-necked flask with a stirring device, a reflux condenser and a thermometer, 413.5 parts of 2,5-xylenol, 103.4 parts of salicylaldehyde, 20.1 parts of p-toluenesulfonic acid and 826.9 parts of methanol were poured, and heated to make the mixture refluxed and then the temperature of the mixture was kept for 4 hours. Then the obtained mixture was cooled, and 1320 parts of methylisobutylketone was fed thereto, followed by distilling 1075 parts of the mixture away under an ordinary pressure.

Then 762.7 parts of m-cresol and 29 parts of 2-tert-butyl-5-methylphenol were added to the residues and heated to 65° C., followed by dropping 678 parts of 37% formalin thereto over a period of 1.5 hours while controlling the temperature of the mixture to be 87'C. at the end of dropping. Then the temperature of the mixture was kept at 87° C. for 10 hours, and then 1115 parts of methylisobutylketone was added to the obtained resin solution, followed by washing it with water three times. To the washed resin solution, 500 parts methylisobutylketone was added, followed by distilling it under reduced pressure until the amount of solution became 3435 parts. To the washed resin solution, 3796 parts of methylisobutylketone and 4990 parts of n-heptane were added and heated to 60° C., and then stirred for an hour, followed by separating therefrom the resin solution of the bottom layer.

To the separated resin solution, 3500 parts of propyleneglycolmonomethylether acetate was added to dilute it, followed by distilling it under reduced pressure until the amount of solution became 1690 parts (43% of solid content). The obtained novolak resin is referred to as "Resin A2-1", the weight average molecular weight of which was 7000.

Synthesis Example 14

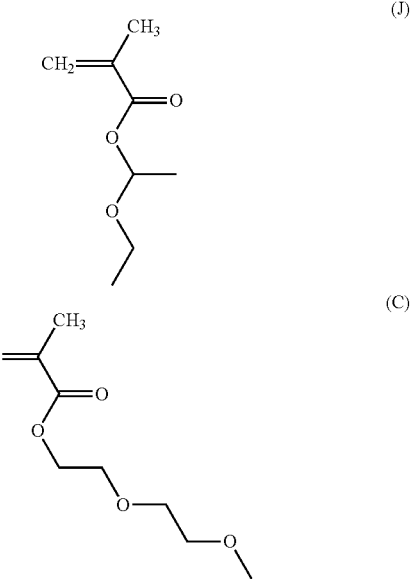

By mixing 12 parts of the compound represented by formula (J), 21.4 parts of compound represented by formula (C), 0.141 parts of azobisisobutyronitrile and 16.7 parts of propyleneglycolmonomethylether acetate, Mixture (11) was obtained.

Into a flask equipped with a thermometer and a stirrer, 33.4 parts of propyleneglycolmonomethylether was fed and then increased its temperature to 80° C. Thereinto, Mixture (11) was dropped while being stirred over a period of one hour, and then heated at 80° C. for nine hours.

Then the reaction mixture was cooled to 40° C. and then diluted with 62.5 parts of propyleneglycolmethylether acetate, and then 203 parts of methanol and 406 parts of ion-exchanged water, followed by collecting precipitated resin by filtration.

To the precipitated resin, 156 parts of propyleneglycolmethylether acetate was added and stirred, followed by concentrating it to obtain 53.9 parts of resin solution (Solid content: 40.4% by weight).

The obtained resin is referred to as "Resin A3-1a", the weight average molecular weight of which was $12 \times 10^4$. Resin A3-1a had the following structural units.

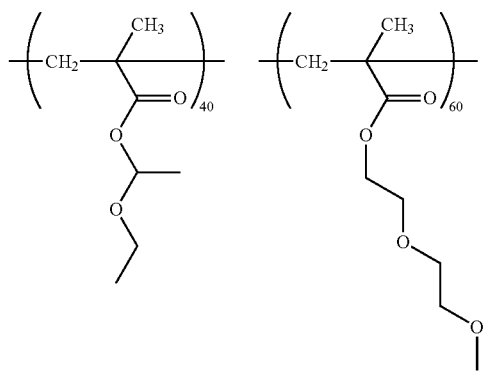

Synthesis Example 16

Twenty (20) parts of polyvinylphenol (Trade name VP-15000, Product of Nippon Soda Co., Ltd.) was dissolved in 240 parts of methylisobutylketone, followed by concentrating it with an evaporator.

To a four-necked flask with a stirring device, a reflux condenser and a thermometer, the concentrated mixture and 0.003 parts of p-toluenesulfonic acid dehydrates were poured and then 5.05 parts of ethylvinylether was dropped thereinto at a temperature of 20 to 25° C. over a period of 10 minutes. The obtained mixture was stirred at the above-mentioned temperature for 2 hours and then diluted with 200 parts of methylisobutylketone, followed by washing it with ion-exchanged water five times.

The washed mixture was concentrated until its amount became 45 parts using an evaporator, and 150 parts of propyleneglycolmonomethylether acetate were added thereto, followed by concentrating it again to obtain 78 parts of propyleneglycolmonomethylether acetate solution (29% of solid content) of resin A3-2, the weight average molecular weight of which was 22100, and in which the content of the ethoxyethyl group were 38.5%. Resin. A3-2 has the following structural units.

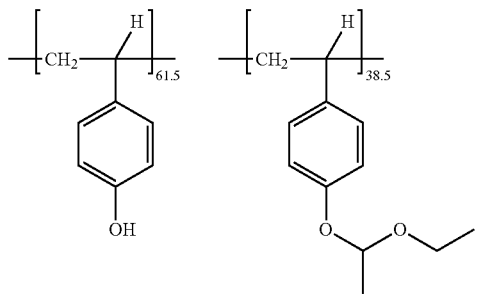

Synthesis Example 17

In 95 parts of acetone, 10.3 parts of 3,5-dihydroxynaphthoic acid was dissolved.

To the obtained mixture, 83.6 parts of potassium carbonate and 28.4 parts of dimethylsulfuric acid were added, followed by being stirred at 50° C. for 12 hours.

The obtained reaction solution was filtrated to thereby remove a solid therefrom, and then the solvent therein was distilled off with an evaporator.

To the obtained residue, 50 parts of ion-exchanged water, 40 parts of methanol and 10 parts of potassium hydroxide were added, and stirred at 65° C. for three hours.

To the reaction solution, 100 parts of hydrochloric acid was added, followed by collecting the precipitated solid to obtain 20 parts of 3,5-dimethoxy-2-naphthoic acid.

In 160 parts of thionyl chloride, 20 parts of 3,5-dimethoxy-2-naphthoic acid was added, and stirred at 80° C. for two hours.

The obtained mixture was set under reduced pressure at 80° C. Then thionyl chloride and the hydrochloric acid, byproducts of the above-mentioned reaction, were distilled off to thereby obtain 20 parts of 3,5-dimethoxy-2-naphthoyl chloride. In 50 parts of methanol, 8.3 parts of N-methylhydroxyamine hydrochloride was dissolved. Into the obtained methanol solution, 60 gram of potassium hydroxide solution (10% in methanol) was dropped while being stirred at 0° C., to thereby obtain. Mixture (12). A solution in which 11.8 parts of 2-naphthoyl chloride was dissolved in 30 parts of THF was added to Mixture (12), followed by being stirred for one hour. The obtained reaction solution was left under room temperature, and then further stirred for one hour, followed by distilling off its solvent therefrom.

The obtained residue was extracted with ethyl acetate and a saturated aqueous sodium chloride solution, followed by isolating an organic layer therefrom. Then, a solvent was distilled off therefrom to collect a white solid.

In 75 parts of chloroform, 20 parts of the obtained solid and 3.8 parts of (+)-10-camphorsulfonyl chloride were dissolved.

Into the obtained mixture, 3.4 parts of pyridine was dropped while being stirred at 0° C.

The obtained mixture was stirred at 50° C. for 8 hours, followed by being extracted with a mixture of chloroform and ion-exchanged water. Then an organic layer was left under reduced pressure to thereby remove a solvent therefrom. Further, the obtained residue was recrystallized with methanol, 3.5 parts of compounds represented by the following formula

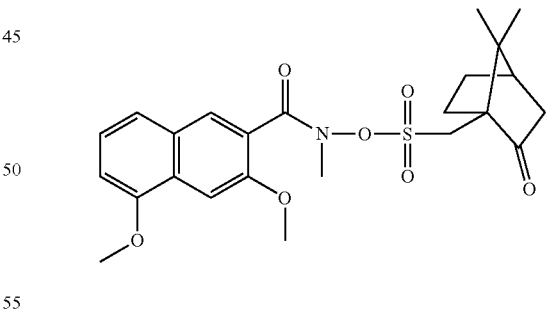

Examples 1 to 5 and Comparative Examples 1 to 2

(Preparation of Photoresist Pattern)

The following components listed in Table 1 were mixed and dissolved in the solvent as mentioned below, and further filtrated through a fluorine resin having pore diameter of 5 μm to prepare photoresist compositions. The contents of the components in each example are shown in Table 1.

The symbols recited in Table 1 represent the following components.

<Resin>

A1-1: Resin A1-1, A1-2: Resin A1-2, A1-3: Resin A1-3, A1-4: Resin A1-4, A1-5: Resin A1-5, A1-6: Resin A1-6, A1-7: Resin A1-7, A1-8: Resin A1-B, A1-9: Resin A1-9, A1-10: Resin A1-10, A2-1: Resin A2-1, A3-1a: Resin A3-1a A3-2: Resin A3-2

<Acid Generator>

B1: The compound represented by formula, trade name "NAI-105" product by Midori Kagaku, Co., Ltd.

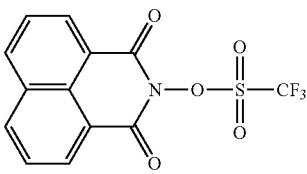 [SMILES: O=C1c2cccc3cccc(c23)C(=O)N1OS(=O)(=O)C(F)(F)F]

B2: The compound represented by formula, prepared in the manner as Synthesis Example 17.

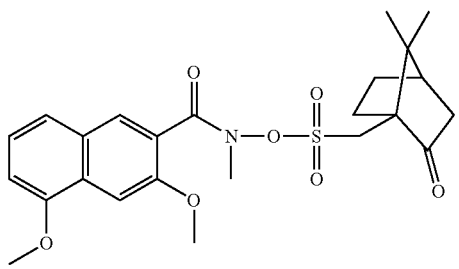 [SMILES: COc1cc2c(OC)cccc2cc1C(=O)N(C)OS(=O)(=O)CC12CCC(CC1=O)C2(C)C]

<Quencher>

C1: 2,4,5-triphenylimidazole (Product of Tokyo Chemical Industry, Co., Ltd.)

<Surfactant>

F1: Polyether denaturated silicone oil (DOW CORNING TORAY SH8400; Product of Toray Dow Corning, Co., Ltd.)

F2: MEGAFACE F477 (brand name)

<Solvent>

D1: Propyleneglycolmonomethylether acetate

TABLE 1

| Ex. No. | Resin (Kind/parts) | Acid generator (Kind/parts) | Quencher (Kind/parts) | Surfactant (I) (parts) (% by wt) | Solvent (parts) (% by wt) | PB (° C.)/ PEB (° C.) |
|---|---|---|---|---|---|---|
| 1 | A1-1/6.075 A2-1/7.425 | B1/0.24 | C1/0.05 | F1/0.00025 (0.0006) | D1/30 (69) | 110/90 |
| 2 | A1-2/6.075 A2-1/7.425 | B1/0.24 | C1/0.05 | F1/0.00025 (0.0006) | D1/30 (69) | 110/90 |
| 3 | A1-3/7.425 A2-1/6.075 | B1/0.24 | C1/0.05 | F1/0.00025 (0.0006) | D1/30 (69) | 110/90 |
| 4 | A1-1/6.075 A2-1/7.425 | B2/0.37 | C1/0.05 | F1/0.00025 (0.0006) | D1/30 (69) | 110/90 |
| 5 | A1-4/4.725 A2-1/8.775 | B1/0.24 | C1/0.05 | F1/0.00025 (0.0005) | D1/40 (74) | 110/90 |
| 6 | A1-5/8.1 A2-1/5.4 | B1/0.07 | C1/0.02 | F1/0.00835 (0.028) | D1/16.2 (54) | 110/90 |
| 7 | A1-6/6.75 A2-1/1.35 A3-2/5.4 | B1/0.07 | C1/0.02 | F2/0.00835 (0.0288) | D1/15.4 (53) | 110/70 |
| 8 | A1-7/1.35 A2-1/3.375 A3-2/8.775 | B1/0.07 | C1/0.02 | F2/0.00835 (0.0277) | D1/15.6 (55) | 110/70 |
| 9 | A1-8/2.03 A2-1/4.05 A3-2/7.43 | B1/0.07 | C1/0.02 | F1/0.00835 (0.0290) | D1/15.2 (53) | 110/70 |
| 10 | A1-9/2.03 A2-1/4.05 A3-2/7.43 | B1/0.07 | C1/0.02 | F1/0.00835 (0.0290) | D1/15.2 (53) | 110/70 |
| 11 | A1-10/2.03 A2-1/4.05 A3-2/7.43 | B1/0.07 | C1/0.02 | F1/0.00835 (0.0290) | D1/15.2 (53) | 110/70 |
| C1 | A3-1a/6.075 A2-1/7.425 | B1/0.24 | C1/0.05 | F1/0.00025 (0.0006) | D1/30 (69) | 110/90 |
| C2 | A3-2/7.425 A2-1/6.075 | B1/0.24 | C1/0.05 | F1/0.00025 (0.0006) | D1/25 (64) | 110/90 |
| C3 | A3-2/7.425 A2-1/6.075 | B1/0.07 | C1/0.02 | F2/0.00835 (0.0307) | D1/13.6 (50) | 110/70 |
| C4 | A3-2/7.425 A2-1/6.075 | B1/0.07 | C1/0.02 | — | D1/13.6 (50) | 110/70 |

Note:

The "C1", "C2", "C3" and "C4" represent respectively Comparative Examples 1, 2, 3 and 4.

(Preparation of Photoresist Pattern)

Over the substrate (4 inches), each of the photoresist compositions prepared as above was spin-coated so that the thickness of the resulting film became 5 μm after drying. The substrates thus coated with the respective photoresist compositions were each prebaked on a direct hotplate at the temperature as shown in the columns "PB" of Table 1 for 180 seconds.

Using an i-ray stepper ("NSR 1755i7A" manufactured by Nikon, NA=0.5) and a mask (line width: 3 μm) for forming a line-and-space pattern, each wafer thus formed with the respective film was subjected to exposure with the exposure quantity being varied stepwise.

After exposure, each wafer was subjected to post-exposure baking on a hotplate at the temperature as shown in the columns "PEB" of Table 1 for 60 seconds.

After the exposure, each wafer was subjected to paddle development for 180 seconds with an aqueous solution of 2.38 wt % tetramethylammonium hydroxide.

(Evaluation)

I. Uniformity of Thickness

The thickness of the composition film after prebaking was measured at five points distant by 25 mm from the middle of the film, whose point-to-point distances were equal to each other, using a spectroscopic reflectometer [Lambda Ace, products made by SCREEN Semiconductor Solutions Co., Ltd.]. The film in which the maximum difference of thickness size was 0.2 μm or more was marked by "X" (bad). The film in which the maximum difference was less than 0.2 μm was marked by "o" (good).

The results of the evaluation are listed in Table 2.

II. Resolution

The photoresist patterns were prepared at the exposure quantity of ES. The minimum line width of the pattern free from the collapse of the line was determined as the value of "Resolution".

In this evaluation, the ES (Effective Sensitivity) means the exposure quantity that the ratio of width between the line and the space was 1:1 at the line width of 3 μm.

The results of the evaluation are listed in Table 2.

TABLE 2

|  | Uniformity of thickness | Resolution (μm) |
| --- | --- | --- |
| Ex. 1 | o | 1 |
| Ex. 2 | o | 1 |
| Ex. 3 | o | 1 |
| Ex. 4 | o | 1 |
| Ex. 5 | o | 1 |
| Comp. Ex. 1 | o | — (No pattern formed) |
| Comp. Ex. 2 | o | — (No pattern formed) |

Examples 6 to 11 and Comparative Examples 3 to 4

(Preparation of Photoresist Pattern)

The components listed in Table 1 were mixed and dissolved in the solvent as mentioned above, and further filtrated through a fluorine resin filter having pore diameter of 15 μm to prepare photoresist compositions. The contents of the components in each example are shown in Table 1.

(Preparation of Photoresist Pattern)

Over the substrate (4 inches), each of the photoresist compositions prepared as above was spin-coated so that the thickness of the resulting film became 50 μm after drying. The substrates thus coated with the respective photoresist compositions were each prebaked on a direct hotplate at the temperature as shown in the columns "PB" of Table 1 for 300 seconds.

Using an i-ray stepper ("NSR 1755i7A" manufactured by Nikon, NA=0.5) and a mask for forming a line-and-space pattern, each wafer thus formed with the respective film was subjected to exposure with the exposure quantity being varied stepwise. After exposure, each wafer was subjected to post-exposure baking on a hotplate at the temperature as shown in the columns "PEB" of Table 1 for 180 seconds.

(Evaluation)

I. Uniformity of Thickness

The thickness of the composition film after prebaking was measured at five points distant by 25 mm from the middle of the film, whose point-to-point distances were equal to each other, using a spectroscopic reflectometer [Lambda Ace, products made by SCREEN Semiconductor Solutions Co., Ltd.]

The film in which the maximum difference of thickness size was 2 μm or more was marked by "χ" (bad). The film in which the maximum difference was less than 2 μm was marked by "o" (good).

The results of the evaluation are listed in Table 3.

II. Resolution

The photoresist patterns were prepared at the exposure quantity of ES. The minimum line width of the pattern free from the collapse of the line was determined as the value of "Resolution".

In this evaluation, the ES (Effective Sensitivity) means the exposure quantity that the ratio of width between the line and the space was 1:1 at the line width of 40 μm.

The results of the evaluation are listed in Table 3.

III. Resistance to Cracking

Over the substrate (4 inches), each of the photoresist compositions prepared as above was spin-coated so that the thickness of the resulting film became 50 μm after drying. The substrates thus coated with the respective photoresist compositions were each prebaked on a direct hotplate at the temperature as shown in the columns "PB" of Table 1 for 300 seconds. Then the prebaked substrates were each baked on a hotplate at 130° C. for 300 seconds, followed by being cooled to 23° C. rapidly. The obtained film which had no crack was marked as "o" (good), and the obtained film which had 10 or more of cracks was marked as "χ" (bad)

The results of the evaluation are listed in Table 3.

TABLE 3

|  | Uniformity of thickness | Resolution (μm) | Resistance to cracking |
| --- | --- | --- | --- |
| Ex. 6 | o | 20 | o |
| Ex. 7 | o | 10 | o |
| Ex. 8 | o | 10 | o |
| Ex. 9 | o | 10 | o |
| Ex. 10 | o | 10 | o |
| Ex. 11 | o | 10 | o |
| Comp. Ex. 3 | o | — (No pattern formed) | x |
| Comp. Ex. 4 | x | — (No pattern formed) | x |

The photoresist composition of the present invention can provide a photoresist film capable of forming a photoresist pattern with fine shape.

What is claimed is:

1. A photoresist composition comprising:

a resin (A1);

a novolak resin (A2);

another resin (A3);

an acid generator; and a solvent, wherein the acid generator is a compound which has a structure represented by formula (B1):

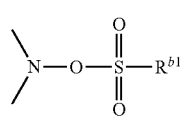

(B1)

where $R^{b1}$ represents a C1-C18 hydrocarbon group which optionally has a fluorine atom and in which a methylene group optionally has been replaced by an oxygen atom or a carbonyl group, and wherein the resin (A1) consists of a structural unit represented by formula (I):

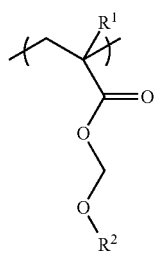

(I)

wherein $R^1$ represents a hydrogen atom, a halogen atom, or a C1 to C6 alkyl group which optionally has a halogen atom, and $R^2$ represents a C1 to C42 hydrocarbon group which optionally has a substituent; and at least one selected from the group consisting of a structural unit represented by formula (a1-1), a structural unit represented by formula (a1-2), a structural unit represented by formula (a2-2), a structural unit represented by formula (a2-3), a structural unit represented by formula (a2-4) and a structural unit having a lactone ring and no acid-labile group:

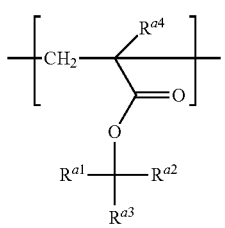

(a1-1)

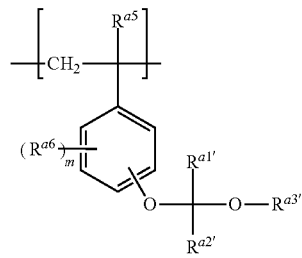

(a1-2)

wherein $R^{a1}$, $R^{a2}$ and $R^{a3}$ each independently represent a C1-C8 alkyl group or a C3 to C20 alicyclic hydrocarbon group, two of $R^{a1}$, $R^{a2}$ and $R^{a3}$ together may represent one C2 to C20 divalent hydrocarbon group where a methylene group can be replaced by an oxygen atom or a sulfur atom, $R^{a1'}$ and $R^{a2'}$ each independently represent a hydrogen atom or a C1 to C12 hydrocarbon group, $R^{a3'}$ represents a hydrogen atom or a C1 to C20 hydrocarbon group, and one of $R^{a1'}$ and $R^{a2'}$ together with $R^{a3'}$ may represent one C2 to C20 divalent heterocyclic group where a methylene group can be replaced by an oxygen atom or a sulfur atom, $R^{a4}$ and $R^{a5}$ each independently represent a hydrogen atom or a methyl group, $R^{a6}$ represents a C1 to C6 alkyl group or a C1 to C6 alkoxy group, and m represents an integer of 0 to 4;

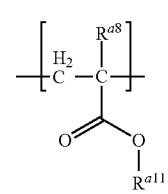

(a2-2)

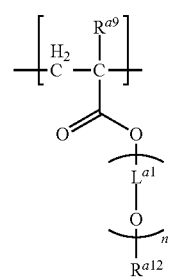

(a2-3)

wherein $R^{a8}$ and $R^{a9}$ each independently represent a hydrogen atom or a methyl group, $R^{a11}$ represents a hydrogen atom, or a C1 to C20 primary or secondary hydrocarbon group, $R^{a12}$ each independently represents a C1 to C6 primary or secondary alkyl group, $L^{a1}$ each independently represents a C2 to C6 alkanediyl group where carbon atoms bonded to an oxygen atom is a primary or secondary carbon atom, and n represents an integer of 1 to 30;

(a2-4)

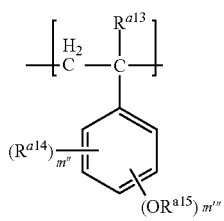

wherein $R^{a13}$ independently represents a hydrogen atom or a methyl group, $R^{a14}$ represents a C1 to C6 alkyl group or a C1 to C6 alkoxy group, $R^{a15}$ each independently represents a C1 to C12 primary or secondary hydrocarbon group where a methylene group can be replaced by an oxygen atom or a carbonyl group provided that the carbon group bonded to the oxygen atom neighboring the benzene ring is not replaced by an oxygen atom, m″ and m‴ each independently represent an integer of 0 to 4 provided that the sum of them is 5 or less, and wherein the another resin (A3) has a structural unit having an acid-labile group other than a structural unit represented by formula (I).

2. The photoresist composition according to claim 1, wherein $R^2$ represents a C1 to C20 linear aliphatic hydrocarbon group, or a C3 to C20 branched aliphatic hydrocarbon group.

3. The photoresist composition according to claim 1, wherein the resin (A1) has a structural unit selected from the group consisting of a structural unit represented by formula (a2-2) and a structural unit represented by formula (a2-3) and a structural unit having a lactone ring and no acid-labile group.

4. The photoresist composition according to claim 3, wherein the resin (A1) has a structural unit selected from the group consisting of the structural unit represented by formula (a2-3) and the structural unit having a lactone ring and no acid-labile group.

5. The photoresist composition according to claim 1, wherein the weight of solvent accounts for 40% to 75% by weight of the total weight of the photoresist composition.

6. The photoresist composition according to claim 1, wherein the another resin (A3) has a structural unit represented by formula (a1-2):

(a1-2)

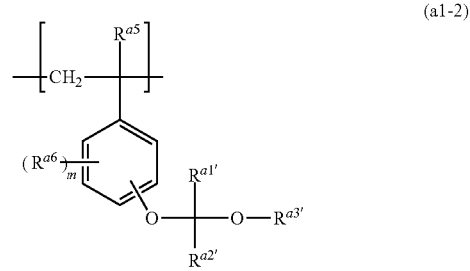

wherein $R^{a1'}$ and $R^{a2'}$ independently each represent a hydrogen atom or a C1 to C12 hydrocarbon group, $R^{a3'}$ represents a C1 to C20 hydrocarbon group, or $R^{a3'}$ are bonded to $R^{a1'}$ or $R^{a2'}$ to form a C2 to C20 divalent heterocyclic group where a methylene group can be replaced by an oxygen atom or a sulfur atom, $R^{a5}$ represents a hydrogen atom or a methyl group, $R^{a6}$ independently each represents a C1 to C6 alkyl group or a C1 to C6 alkoxy group, and m represents an integer of 0 to 4.

7. A process for producing a photoresist pattern comprising:
(1) a step of applying the photoresist composition according to claim 1 on a substrate,
(2) a step of forming a photoresist composition film by drying the photoresist composition,
(3) a step of exposing the photoresist composition film, and
(4) a step of developing the exposed photoresist composition film.

* * * * *